(12) United States Patent
Higashi et al.

(10) Patent No.: US 7,839,711 B2
(45) Date of Patent: Nov. 23, 2010

(54) SEMICONDUCTOR MEMORY DEVICE AND DRIVING METHOD THEREOF

(75) Inventors: Tomoki Higashi, Yokohama (JP); Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 12/352,876

(22) Filed: Jan. 13, 2009

(65) Prior Publication Data

US 2009/0180342 A1 Jul. 16, 2009

(30) Foreign Application Priority Data

Jan. 16, 2008 (JP) ............................. 2008-006609
Mar. 28, 2008 (JP) ............................. 2008-087304

(51) Int. Cl.
    *G11C 7/00* (2006.01)
(52) U.S. Cl. .................. 365/222; 365/189.11; 365/203; 365/230.06
(58) Field of Classification Search ................. 365/222, 365/189.11, 203, 230.06
See application file for complete search history.

(56) References Cited

U.S. PATENT DOCUMENTS

| | | | |
|---|---|---|---|
| 6,847,566 B1 * | 1/2005 | Han et al. | .................... 365/203 |
| 6,982,918 B2 | 1/2006 | Fazan et al. | |
| 7,170,807 B2 | 1/2007 | Fazan et al. | |
| 7,440,329 B2 * | 10/2008 | Ohsawa | .................... 365/185.2 |
| 2008/0316849 A1 | 12/2008 | Ohsawa | |

OTHER PUBLICATIONS

U.S. Appl. No. 12/243,195, filed Oct. 1, 2008, Takashi Ohsawa, et al.
S. Okhonin, et al., "Principles of Transient Charge Pumping on Partially Depleted SOI MOSFETs", IEEE Electron Device Letters, vol. 23, No. 5, May 2002, pp. 279-281.
Guido Groeseneken, et al., "A Reliable Approach to Charge-Pumping Measurements in MOS Transistors", IEEE Transactions on Electron Devices, vol. ED-31, No. 1, Jan. 1984, pp. 42-53.
P. Fazan, et al., "A New Block Refresh Concept for SOI Floating Body Memories", IEEE International SOI Conference, 2003, pp. 15 and 16.

* cited by examiner

*Primary Examiner*—Connie C Yoha
(74) *Attorney, Agent, or Firm*—Oblon, Spivak, McClelland, Maier & Neustadt, L.L.P.

(57) ABSTRACT

A memory including; cells, wherein a refresh operation includes a first refresh and a second refresh, in the first refresh, a first potential higher than a gate potential in a retention is applied to the gate in a state having a source potential applied to the drain, and thereafter the gate potential in the retention is applied to the gate, thereby a first current passes to the cell, and in the second refresh, a second potential higher than a gate potential in the retention is applied to the gate, and a third potential higher than the gate potential in the retention is applied to the drain, thereby a second current passes to the cell, and a state of the cell is shifted to an equilibrium state in which amounts of the first and the second currents flowing during one cycle becomes substantially equal.

22 Claims, 14 Drawing Sheets

FIRST EMBODIMENT

FIRST EMBODIMENT

REFRESH OPERATION OF DATA "0"

REFRESH OPERATION OF DATA "1"

SEVENTH EMBODIMENT

EIGTH EMBODIMENT

NINTH EMBODIMENT

TENTH EMBODIMENT

ELEVENTH EMBODIMENT

SEMICONDUCTOR MEMORY DEVICE AND DRIVING METHOD THEREOF

CROSS-REFERENCE TO RELATED APPLICATIONS

This application is based upon and claims the benefit of priority from the prior Japanese Patent Applications No. 2008-6609, filed on Jan. 16, 2008, and No. 2008-87304, filed on Mar. 28, 2008, the entire contents of which are incorporated herein by reference.

BACKGROUND OF THE INVENTION

1. Field of the Invention

The present invention relates to a semiconductor memory device and a driving method thereof.

2. Related Art

In recent years, there are FBC memory devices as a semiconductor memory device expected to be an alternative to 1T (Transistor)-1C (Capacitor) DRAMs as a memory. The FBC memory device has an FET (Field Effect Transistor) formed to include a floating body (hereinafter, also called "body") on an SOI (Silicon On Insulator) substrate. The FBC memory device stores data "1" or data "0" based on the number of majority carriers accumulated in this body. For example, in an FBC including N-FETs, a state of a large number of holes accumulated in the body is set as data "1", and a state of a small number of holes accumulated in the body is set as data "0". A memory cell storing the data "0" is called a "0" cell, and a memory cell storing the data "1" is called a "1" cell.

The FBC is better than conventional DRAMs for downsizing. However, electrostatic capacitance of the body accumulating a charge is smaller than electrostatic capacitance of a capacitor of the conventional DRAM. Therefore, a data holding time of the FBC is shorter than that of the DRAM, although a leak current from the body of the FBC is smaller than a leak current from a capacitor of the DRAM. Accordingly, a refresh operation needs to be performed frequently. As a result, a proportion of time (refresh busy rate) for prohibiting reading to the outside/writing from the outside becomes large. Further, the power necessary to hold data becomes larger than that of conventional DRAMs. Particularly, large power consumption in a portable device is a significant problem.

Conventionally, in a refresh method using a charge pumping phenomenon, a gate voltage equal to or smaller than a threshold voltage is applied to the "0" cells. Therefore, a channel is not formed, and electrons are not sufficiently trapped in a surface state between a gate dielectric film and the body. Consequently, the "0" cells are not sufficiently refreshed (see U.S. Pat. No. 6,982,918).

SUMMARY OF THE INVENTION

A semiconductor memory device according to an embodiment of the present invention comprises: a semiconductor layer; a source layer and a drain layer provided within the semiconductor layer; a body region provided in the semiconductor layer between the source layer and the drain layer, the body region being in an electrically floating state, and the body region accumulating a charge or discharging a charge to store logic data; a gate dielectric film provided on the body region; a gate electrode provided on the body region via the gate dielectric film; a driver driving the gate electrode; and a sense amplifier sensing logic data from a memory cell including the source layer, the drain layer, and the body region, or writing logic data to the memory cell, wherein
a refresh operation recovering degradation of logic data of the memory cell includes a first refresh operation and a second refresh operation,
in the first refresh operation, a first potential higher than a potential of the gate electrode in a data holding state is applied to the gate electrode in a state having a potential substantially equal to a potential of the source layer applied to the drain layer, and thereafter a potential of the gate electrode in the data holding state is applied to the gate electrode, thereby a first current passes to the memory cell, and
in the second refresh operation, a second potential higher than a potential of the gate electrode in the data holding state is applied to the gate electrode, and a third potential higher than a potential of the gate electrode in the data holding state is applied to the drain layer, thereby a second current passes to the memory cell, and
a state of the memory cell is shifted to an equilibrium state in which an amount of the first current flowing during one cycle of the refresh operation becomes substantially equal to an amount of the second current flowing during one cycle of the refresh operation.

A driving method of a semiconductor memory device according to an embodiment of the present invention, the semiconductor memory device comprising: a semiconductor layer; a source layer and a drain layer provided within the semiconductor layer; a body region provided in the semiconductor layer between the source layer and the drain layer, the body region being in an electrically floating state, and the body region accumulating a charge or discharging a charge to store logic data; a gate dielectric film provided on the body region; a gate electrode provided on the body region via the gate dielectric film; a driver driving the gate electrode; and a sense amplifier sensing logic data from a memory cell including the source layer, the drain layer, and the body region, or writing logic data to the memory cell,
the method comprises:
a refresh operation recovering degradation of logic data of the memory cell includes a first refresh operation and a second refresh operation,
in the first refresh operation, a first potential higher than a potential of the gate electrode in a data holding state is applied to the gate electrode in a state having a potential substantially equal to a potential of the source layer applied to the drain layer, and thereafter a potential of the gate electrode in the data holding state is applied to the gate electrode, thereby a first current passes to the memory cell, and
in the second refresh operation, a second potential higher than a potential of the gate electrode in the data holding state is applied to the gate electrode, and a third potential higher than a potential of the gate electrode in the data holding state is applied to the drain layer, thereby a second current passes to the memory cell, and
a state of the memory cell is shifted to an equilibrium state in which an amount of the first current flowing during one cycle of the refresh operation becomes substantially equal to an amount of the second current flowing during one cycle of the refresh operation.

DETAILED DESCRIPTION OF THE INVENTION

Embodiments of the present invention will be explained below in detail with reference to the accompanying drawings. Note that the invention is not limited thereto.

First Embodiment

Figure 1:
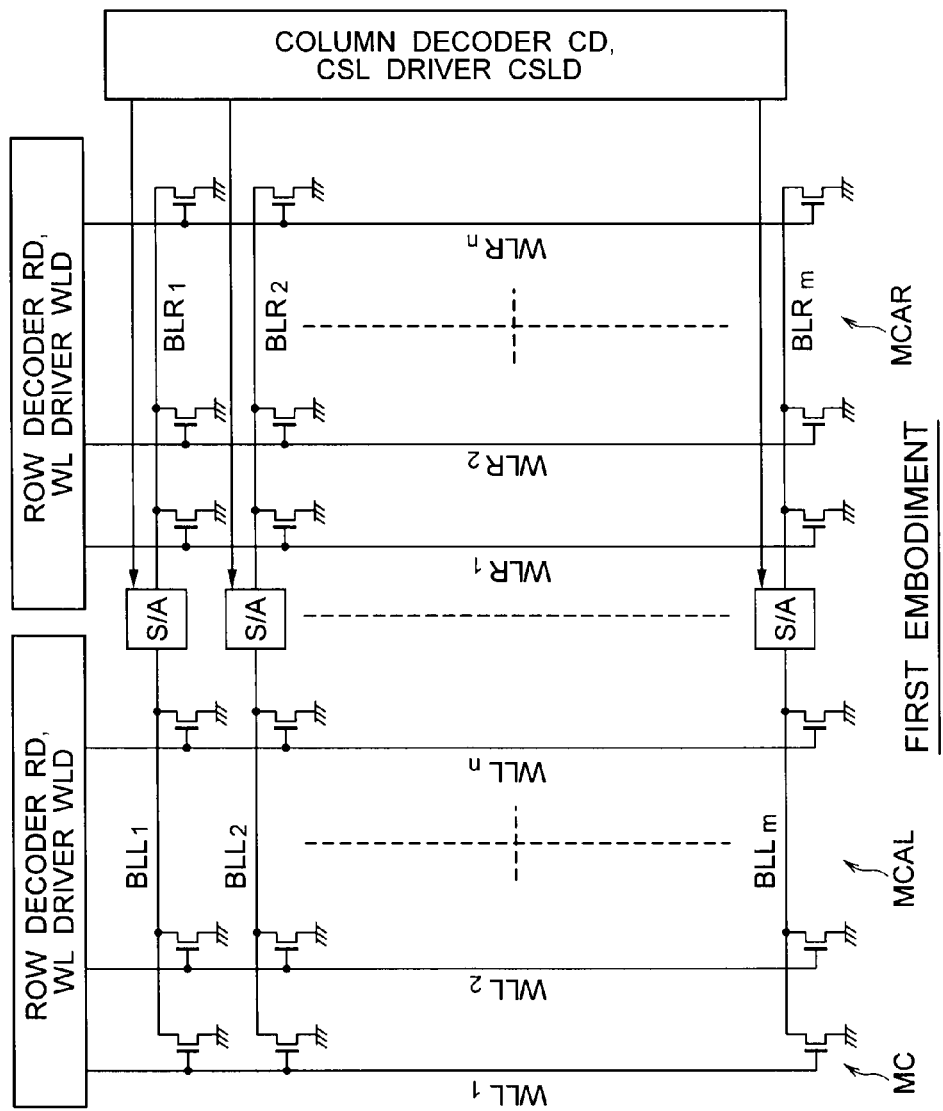
FIG. 1 shows one example of a configuration of an FBC memory device according to a first embodiment of the present invention.

FIG. 1 shows one example of a configuration of an FBC memory device according to a first embodiment of the present invention. The FBC memory device includes memory cells MCs, word lines WLL0 to WLLn, WLR0 to WLRn (hereinafter, also called WLs), bit lines BLL0 to BLLm, BLR0 to BLRm (hereinafter, also called BLs), sense amplifiers S/As, row decoders RDs, WL drivers WLDS, column decoders CDs, and CSL drivers CSLDs.

The memory cells MCs are arranged two dimensionally in a matrix shape, thereby constituting memory cell arrays MCAL and MCAR (hereinafter, also called MCAs). The word lines WLs are extended to a row direction, and also function as gates (first gate electrodes) of the memory cells MCs. The word lines WLs are provided by (n+1) at each of left and right sides of each sense amplifier S/A. The bit lines BLs are extended to a column direction, and are connected to sources or drains of the memory cells MCs. The bit lines BLs are provided by (m+1) at each of left and right sides of each sense amplifier S/A. The word lines WLs and the bit lines BLs are orthogonal with each other, and the memory cells MCs are provided at these intersections. These cells are called cross-point type cells. The row direction and the column direction are called for the sake of convenience, and the row direction and the column direction can be replaced with each other.

In data read/write operations, one of a bit line pair BLL and BLR connected to both sides of each sense amplifier S/A transmits data of the memory cells MCs, and the other passes a reference current Iref. The reference current Iref is substantially an intermediate current between a current flowing to the "0" cells and a current flowing to the "1" cells. To generate the reference current Iref, dummy cells, dummy word lines, averaging circuits, and dummy writing circuits become necessary, but these are omitted here. Each sense amplifier S/A passes a current to the memory cells MCs via one of the bit lines BLs. With this arrangement, a current corresponding to the data of the memory cells MCs flows through a sense node within the sense amplifier S/A. The sense amplifier S/A identifies a logic value "1" or "0", based on whether the current flowing through the sense node is higher or lower than the reference current Iref. A system of storing one bit into one memory cell in this way is called a one-cell/bit (single cell) system.

Alternatively, in the data read/write operations, one data of the bit line pair BLL and BLR connected to both sides of the sense amplifier S/A can be used as reference data of the other data, and the other data can be used as reference data of the one data. In this case, two selection memory cells connected to the bit line pair BLL and BLR need to store mutually complementary data (data "1" and data "0"). Because the two memory cells store one bit, this system is called a two-cell/bit (twin cell) system. The first embodiment can be applied to both the single-cell system and the twin-cell system. The first embodiment can be also applied to other systems.

Each row decoder RD decodes a row address to select a specific word line out of plural word lines WLs. Each WL driver WLD applies a voltage to a selection word line, thereby activating this selection word line.

Each column decoder CD decodes a column address to select a specific column out of plural columns. Each CSL driver CSLD applies a potential to a selected column-selection line CSL, thereby reading data from the sense amplifier S/A to a DQ buffer (not shown). The polarity of a voltage indicates a voltage from a reference potential to a positive direction or a negative direction, when a ground potential or a source potential is used as the reference potential. The polarity of data indicates complementary data "1" or data "0".

Figure 2:
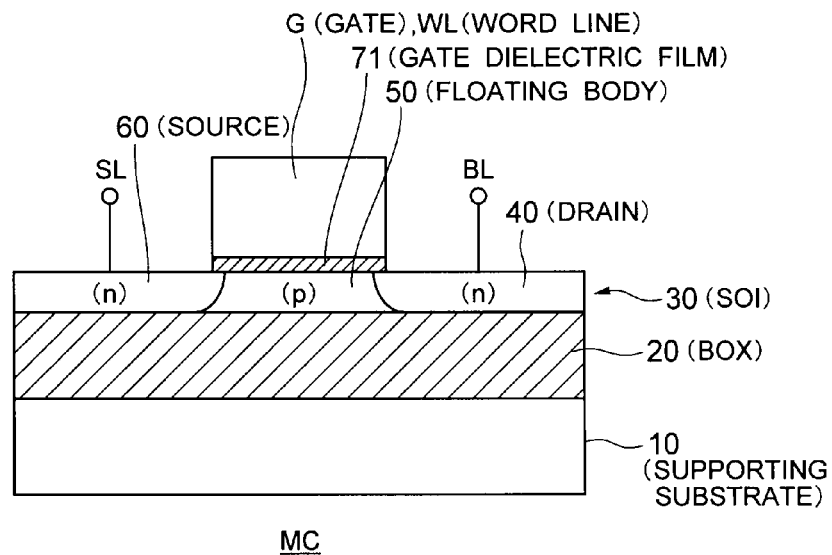
FIG. 2 is a cross-sectional view showing one example of a configuration of each memory cell MC.

FIG. 2 is a cross-sectional view showing one example of a configuration of each memory cell MC. The memory cell MC is provided on an SOI substrate including a supporting substrate 10, a BOX layer 20, and an SOI layer 30. A source 60 and a drain 40 are provided in the SOI layer 30. A floating body 50 is formed in the SOI layer 30 between the source 60 and the drain 40. The body 50 is a semiconductor having opposite conductivity to those of the source 60 and the drain 40. In the first embodiment, the memory cells MCs are N-FETs. The body 50 is in an electrically floating state by having a part or a whole of the body 50 surrounded by the source 60, the drain 40, the BOX layer 20, a gate dielectric film 71, and an STI (Shallow Trench Isolation) (not shown). The FBC memory device can store logic data (binary data) based on the number of majority carriers within the body 50.

The gate dielectric film 71 is provided on an upper surface of the body 50. The word lines (gate electrodes) WLs are provided on the upper surface of the body 50 via the gate dielectric film 71.

One example of a method of writing data into each memory cell MC is explained below. To write the data "1" into the memory cell MC, the memory cell MC is operated in a saturated state. For example, the word line WL is biased at 1.5 V, and the bit line BL is biased at 2.2 V. The source is at the ground GND (0 V). With this arrangement, impact ionization occurs near the drain, and a large number of electron hole pairs are generated. Electrons generated by the impact ionization flow to the drain, and the holes are accumulated in the body having a low potential. When a current flowing at the generation of the holes in the impact ionization is balanced with a forward current at a pn junction between the body and the source, a body voltage reaches an equilibrium state. This body voltage is about 0.7 V.

To write the data "0", the bit lines BLs are decreased to a negative voltage. For example, the word lines WLs are biased at 1.5 V, and the potential of each bit line BL is decreased to −1.5 V. Based on this operation, a pn junction between the body 50 and the drain 40 is biased to a forward direction to a large extent. Holes accumulated in the body 50 are discharged to the drain 40, and the data "0" is stored in the memory cells MCs.

In the data holding state, a potential of each word line WL is a deeply negative potential, and is set to −2 V, for example. A potential of each bit line BL is fixed to the ground potential similar to the source potential. With this arrangement, the body potential becomes lower than the source potential and the drain potential. Accordingly, the "1" cells can hold holes.

One example of a method of reading data from the memory cells MCs is explained below. In the data read operation, the word lines WLs are activated so that the "0" cells and the "1" cells are turned on. The bit lines BLs are set lower than those at the time of writing the data "1". For example, the word lines WLs are set at 1.0 V, and the bit lines BLs are set at 0.2 V. With this arrangement, the memory cells MCs are operated in a linear region. The "0" cells and the "1" cells are different in threshold voltages of the memory cells MCs, depending on a difference between numbers of holes accumulated in the body 50. The sense amplifier S/A discriminates between the data "1" and the data "0" by detecting a difference between currents flowing between the source and the drain generated by the difference between the threshold values. The bit lines BLs are set to low voltages during a reading time for the following reason. When the voltage of each bit line BL is set high to bias the memory cells MCs to a saturated state, there is a risk that the "0" cells are changed to the "1" cells due to impact ionization at the time of reading the data "0".

The refresh operation recovers degraded data of the "1" cells and the "0" cells. More specifically, the refresh operation replenishes holes into the "1" cells and also extracting the holes from the "0" cells. By performing the refresh operation, a signal difference between the data "1" and the data "0" is recovered substantially as large as that of the data writing time.

In the conventional refresh operation, a sense amplifier once reads data from the memory cells MCs, and writes back logic data which is the same as this data to the memory cells MCs. However, in the refresh operation according to the first embodiment, the sense amplifier does not read out the data from the memory cells MCs. In the refresh operation according to the first embodiment, the same proper word line potential VWL and the same proper bit line potential VBL are applied to both the "0" cells and the "1" cells, without reading the data, thereby simultaneously and autonomously refreshing both the "0" cells and the "1" cells using a body potential difference between the "0" cells and the "1" cells. This refresh operation is called "autonomous refresh". A method of driving the word line potential VWL and the bit line potential VBL is described later.

Figure 3A:
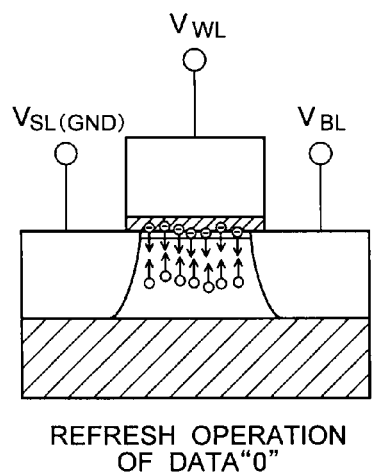
FIG. 3A and FIG. 3B are conceptual diagrams showing an autonomous refresh according to the first embodiment.
Figure 3B:
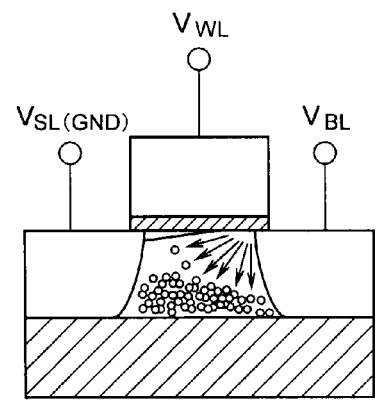

FIG. 3A and FIG. 3B are conceptual diagrams showing an autonomous refresh according to the first embodiment. FIG. 3A shows a refresh operation of the data "0" using both or either one of a charge pumping phenomenon and a supply of electrons from a channel. FIG. 3B shows a refresh operation of the data "1" using impact ionization. The word line potential VWL is controlled so that writing (impact ionization) of the data "1" shown in FIG. 3B is generated in only the "1" cells and is not generated in the "0" cells. On the other hand, a writing of the data "0" shown in FIG. 3A (both or either one of a charge pumping phenomenon and a supply of electrons from a channel) shown in FIG. 3A cannot be selectively performed to only the "0" cells, and therefore, are performed to both the "0" cells and the "1" cells. However, the number of holes vanished by both or either one of a one-time charge pumping phenomenon and a supply of electrons from a channel is much smaller than the number of holes accumulated in the "1" cells, and the influence given to the "1" cells is small. On the other hand, to vanish a small amount of holes accumulated in the "0" cells at the data holding time, both or either one of a charge pumping phenomenon and a supply of electrons from a channel is effective means.

The charge pumping phenomenon is a phenomenon that positive holes are extracted from the body as a result of recombination between electrons trapped in the surface state present at the interface between the silicon substrate and the gate dielectric film and holes within the body. Therefore, density of the interface state between the body and the gate dielectric film is important.

The supply of electrons from a channel is a phenomenon that a part of electrons forming an inverted layer when the inverted layer (channel) formed near the surface of the body 50 is vanished are coupled with holes within the body 50 and are vanished. Even the "0" cells not having the surface level can be refreshed by supplying electrons from the channel.

Figure 4:
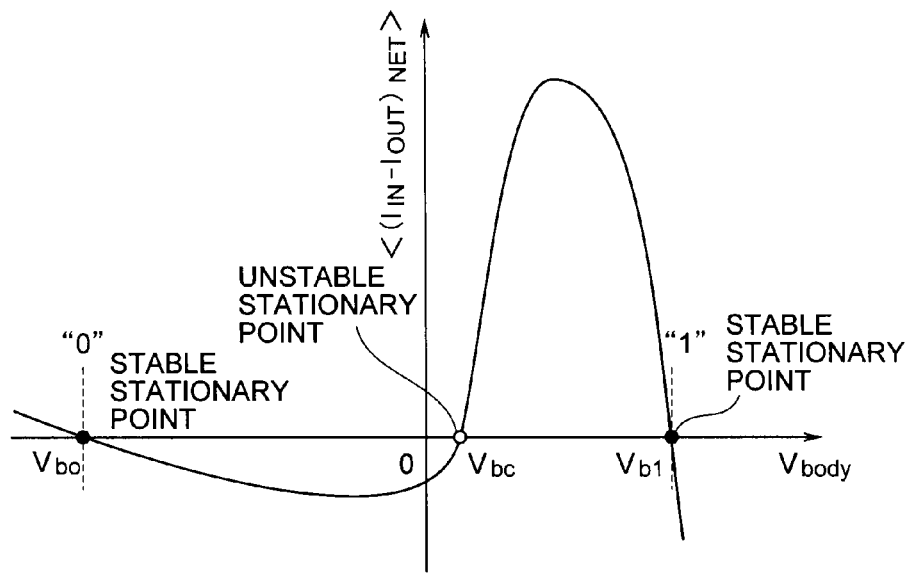
FIG. 4 is a graph showing a relationship between a body potential and a body current of the FBC memory device according to the first embodiment.

FIG. 4 is a graph showing a relationship between a body potential and a body current of the FBC memory device according to the first embodiment. The body current is a difference between a total current Iin flowing to the body 50 and a total current Iout flowing out from the body 50 averaged over the refresh operation period. In the first embodiment, the body current is $<(Iin-Iout)_{NET}>$. The amount of current Iin flowing to the body 50 and the amount of current Iout flowing out from the body 50 make two stable stationary points and one unstable stationary point. Body potentials Vb0 and Vb1 corresponding to the two stable stationary points are present at both sides of a body potential Vbc corresponding to the one unstable stationary point.

The curve in FIG. 4 shows that the net body current is zero (Iin=Iout) at the body potentials Vb0, Vbc, and Vb1. When a body potential Vbody is smaller than Vb0, there is a relationship of Iin>Iout, and the body potential Vbody increases and comes close to Vb0. When the body potential Vbody is present between Vb0 and Vbc, there is a relationship of Iin<Iout, and the body potential decreases and comes close to Vb0. When the body potential Vbody is present between Vbc and Vb1, there is a relationship of Iin<Iout, and the body potential increases and comes close to Vb1. When the body potential Vbody is larger than Vb1, there is a relationship of Iin<Iout, and the body potential decreases and comes close to Vb1. As explained above, the body current autonomously adjusts the number of holes within the body 50 so that the body potential Vbody converges to either Vb0 or Vb1. Therefore, Vb0 and Vb1 are called stable stationary points of the body potential.

On the other hand, once the body potential Vbody is deviated from Vbc, the body potential Vbody moves to Vb0 or Vb1. Therefore, Vbc is an unstable stationary point.

Assume that a body potential of each "0" cell is Vb0 and that a body potential of each "1" cell is Vb1. In this case, when the "0" cells and the "1" cells do not receive a large degradation to exceed the unstable stationary point Vbc, a body potential of each "0" cell and each "1" cell can be returned to Vb0 and Vb1, respectively, by passing only the body currents, even when the body currents of the "0" cells and the "1" cells are deviated from Vb0 and Vb1. That is, when the data of the "0" cells and the "1" cells are degraded, both the "0" cells and the "1" cells can be collectively and autonomously refreshed by passing a charge pumping current, a current based on electrons supplied from a channel, and an impact ionization current. In this case, voltages of the word lines WLs, the bit lines BLs, and the sources are set to each memory cell MC based on the same condition. That is, the autonomous refresh according to the first embodiment can autonomously refresh both the "0" cells and the "1" cells in a state that voltages of the word line WLs are set to substantially equal values in all rows, and that voltages of the bit line BLs are set to substantially equal values in all columns. With this arrangement, data does not need to be read to the sense amplifier, and plural memory cells connected to the same bit line BL can be collectively (at one-time access) refreshed.

Figure 5:
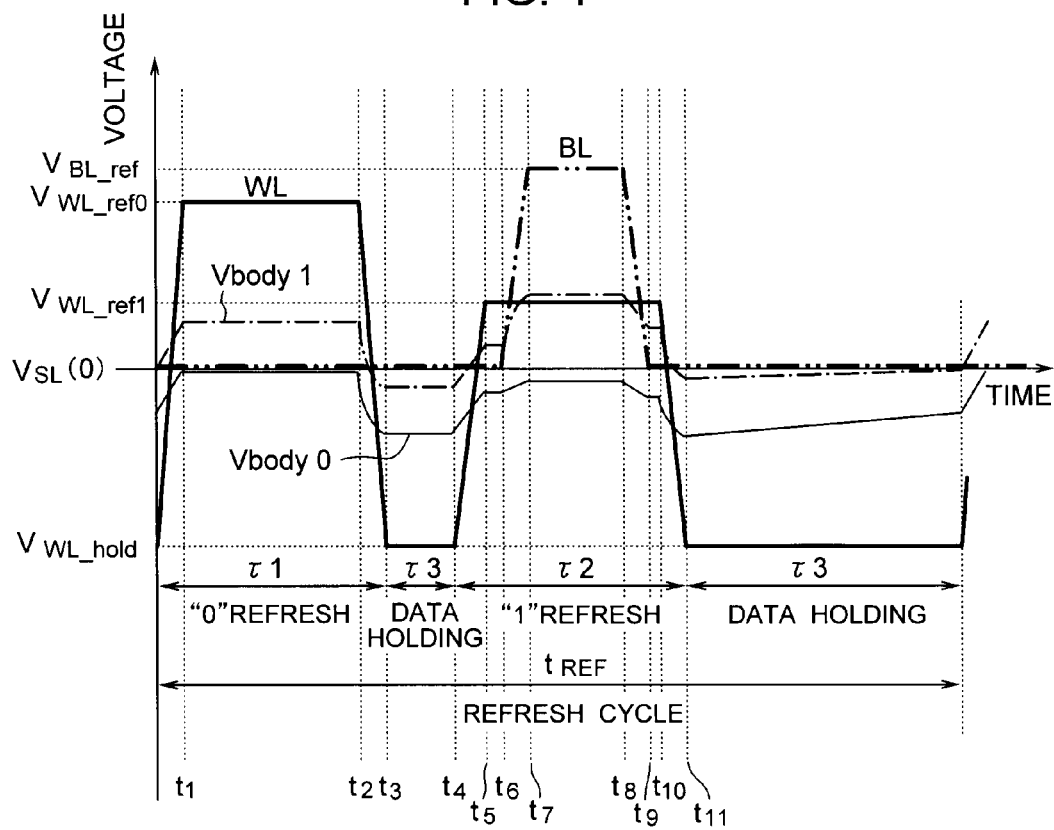
FIG. 5 is a timing diagram showing an autonomous refresh operation according to the first embodiment.

FIG. 5 is a timing diagram showing an autonomous refresh operation (hereinafter, also simply called "refresh") according to the first embodiment. The body current is explained with reference to FIG. 5. The body current can be expressed by an equation 1.

$$<(Iin-Iout)_{NET}>=<(Iin1-Iout1)_{NET}>+<(Iin2-Iout2)_{NET}>+<(Iin3-Iout3)_{NET}>$$ (Equation 1)

$<(Iin-Iout)_{NET}>$ shows an average current during one cycle of a refresh operation of a difference between the total current Iin flowing to the body 50 and the total current Iout flowing out from the body 50. In a body holding mode, one cycle $\tau REF$ can be divided into a "0" refresh period $\tau 1$ as a first refresh period, a "1" refresh period $\tau 2$ as a second refresh period, and a data holding period $\tau 3$ as shown in FIG. 5.

In the "0" refresh period $\tau 1$, a difference between the current Iin flowing to the body 50 and the current Iout flowing out from the body 50 is expressed as $<(Iin1-Iout1)_{NET}>$. In the "1" refresh period $\tau 2$, a difference between the current Iin flowing to the body 50 and the current Iout flowing out from the body 50 is expressed as $<(Iin2-Iout2)_{NET}>$. In the data holding period $\tau 3$, a difference between the current Iin flowing to the body 50 and the current Iout flowing out from the body 50 is expressed as $<(Iin3-Iout3)_{NET}>$.

$<(Iin1-Iout1)_{NET}>$ is a value obtained by averaging the currents flowing to and the currents flowing from the body 50 during a total period of the "0" refresh period $\tau 1$, and is substantially determined by mainly a charge pumping current and electrons supplied from the channel. $<(Iin1-Iout1)_{NET}>$ can be expressed by an equation 2.

$$<(Iin1-Iout1)_{NET}>=(Iii1+IGIDL1+IPN1+ICP1+Ich1)\times \Sigma 1/\tau REF$$ (Equation 2)

In the above equation 2, Iii1 is a positive hole current (an impact ionization current) generated by the impact ionization. IGIDL1 is a positive hole current based on GIDL (Gate Induced Drain Leakage). IPN1 is a current flowing through a PN junction between the body and the source or between the body and the drain. ICP1 is a current (a charge pumping current) based on a charge pumping phenomenon generated in a moment when a voltage of each word line WL at a high level potential is decreased to a low level potential. Ich1 is a current (electrons supplied from the channel) based on a recombination of the electrons forming the inverted layer (the channel) and the holes accumulated in the body 50.

The charge pumping current ICP1+Ich1 is $(qNit+\alpha Cox(VWL\_ref0-VTH(Vbody))/\tau 1$. In this ICP1, q is an absolute value of an element charge, Nit is the number of surface states per one cell (the number of positive holes vanished from the body), Cox is a gate capacitance, and VTH (Vbody) is a threshold voltage. Further, $\alpha$ is a constant smaller than 1, and depends on a transistor shape and a fall speed of a gate voltage.

At t1 shown in FIG. 5, a potential of each word line WL is increased from a voltage VWL_hold in the data holding state to VWL_ref0. VWL_ref0 is a positive potential of a polarity opposite to that of the voltage WVL_hold, and is higher than each threshold voltage of the "0" cell and each "1" cell. VWL_ref0 is a potential higher than VWL_hold. After the high level potential VWL_ref0 is applied to the word line WL, the voltage of each word line WL is returned to the potential VWL_hold in the data holding state at t2 to t3. The charge pumping current ICP1 and the electrons Ich1 supplied from the channel are generated near the time t3 at which the word line potential is decreased. At t1 to t6, the voltages of the bit lines BLs are substantially equal to the source potential (ground potential).

In the equation 2, $\tau 1/\tau REF$ is a rate of a period of a first refresh operation to one refresh cycle. The charge pumping current ICP and the electrons Ich supplied from the channel cannot be necessarily clearly discriminated, and both are sometimes observed collectively.

In the equation 2, a positive value means that holes (current) flow into the body 50, and a negative value means that holes (current) flow out from the body 50. During the period of $\tau 1$, the potential of each bit line BL is equal to the potential of the source layer. Therefore, the impact ionization current Iii1 and the GIDL current IGIDL1 are very small, and are near zero. IPN1 can be a positive value or a negative value depending on each potential of the drain 40, the body 50, and the source 60, respectively. IPN1 is also very small, and is near zero. The body potential Vbody1 of each "1" cell is higher than the source potential and the bit line potential (the ground potential). However, IPN1 in the "1" cell can be set to substantially zero by setting the period of $\tau 1$ to always a short time.

On the other hand, the charge pumping current ICP1 and the electrons Ich1 supplied from the channel are negative-value currents flowing when the voltage of each word line WL is shifted from VWL_ref0 to VWL_hold. During the period of $\tau 1$, main components of the body current are the charge pumping current ICP1 and the electrons Ich1 supplied from the channel. Therefore, during the period of $\tau 1$, holes within the body 50 are discharged by the charge pumping current ICP1 and the electrons Ich1 supplied from the channel. That is, electrons are supplied to the body 50 by the charge pumping current ICP1 and the electrons Ich1 supplied from the channel. Accordingly, the holes are vanished.

When there are other currents flowing to and the currents flowing from the body 50, these currents can be added to the parenthesis at the left side of the equation 2.

$<(Iin2-Iout2)_{NET}>$ is a value obtained by averaging the currents flowing to and the currents flowing from the body 50 during a total period of the "1" refresh period $\tau 2$, and is substantially determined by mainly an impact ionization current. $<(\text{Iin2}-\text{Iout2})_{NET}>$ can be expressed by an equation 3.

$$<(\text{Iin2}-\text{Iout2})_{NET}> = (\text{Iii2}+\text{IGIDL2}+\text{IPN2}+\text{ICP2}+\text{Ich2})\times\tau 2/\tau R\, EF \quad \text{(Equation 3)}$$

In the above equation, Iii2 is an impact ionization current during the period of τ2. IGIDL2 is a positive hole current based on GIDL during the period of τ2. IPN2 is a current flowing to a PN junction between the body and the source or between the body and the drain during the period of τ2. ICP2 is a charge pumping current during the period of τ2. ICP2=qNit/τ2. Ich2 is βCox(VWL_ref1−VTH(VBODY))/τ2 and is due to electrons supplied from the channel during the period of τ2. β is a constant smaller than 1, and depends on a transistor shape and a fall speed of a gate voltage.

During t4 and t5 shown in FIG. 5, a potential of each word line WL is increased from VWL_hold to VWL_ref1. VWL_ref1 is a potential higher than VWL_hold and lower than VWL_ref0. Therefore, a potential difference between VWL_ref0 and the source potential VSL based on the "0" refresh is larger than a potential difference between VWL_ref1 based on the "1" refresh and the source potential VSL. VWL_ref1 can be equal to VWL_ref0. This is because although the impact ionization current decreases based on the "1" refresh, the effect of the first embodiment is not lost when the equation 1 is established. Alternatively, VWL_ref0 can be equal to VWL_ref1. In this case, while the charging pumping current based on the "0" refresh decreases, the effect of the first embodiment is not lost when the equation 1 is established.

During t6 and t7, a potential of each bit line BL is increased from the ground potential to VBL_ref. VWL_ref1 and VBL_ref are positive potentials having a polarity opposite to that of VWL_hold. Accordingly, the impact ionization is selectively generated in only the "1" cells, and is not generated in the "0" cells or very small if any. The impact ionization current Iii2 is much larger than other current components. Therefore, holes are supplied to the "1" cells.

During t10 and t11, when the potential of each word line WL is decreased from VWL_ref1 to VWL_hold, the charge pumping current ICP2 and the current Ich2 based on the electrons supplied from the channel flow to the "1" cells. Therefore, the charge pumping current ICP and the current Ich based on the electrons supplied from the channel flow to the "1" cells twice at t3 and t11. However, the impact ionization current is much larger than the charge pumping current ICP and the current Ich based on the electrons supplied from the channel for the "1" cells. Therefore, the "1" cells can be sufficiently refreshed during the period of τ2.

$<(\text{Iin3}-\text{Iout3})_{NET}>$ is a value obtained by averaging the currents flowing to and the currents flowing from the body 50 during a total period of the data holding period τ3, and is substantially determined by mainly the GIDL current. $<(\text{Iin3}-\text{Iout3})_{NET}>$ can be expressed by an equation 4.

$$<(\text{Iin3}-\text{Iout3})_{NET}> = (\text{Iii3}+\text{IGIDL3}+\text{IPN3}+\text{ICP3}+\text{Ich3})\times\tau 3/\tau R\, EF \quad \text{(Equation 4)}$$

In the above equation, Iii3 is an impact ionization current during the period of τ3. IGIDL3 is a positive hole current based on GIDL during the period of τ3. IPN3 is a current flowing to the PN junction between the body and the source or between the body and the drain during the period of τ3. ICP3 is a charge pumping current during the period of τ3. Ich3 is a current supplied from the channel during the period of τ3. τ3/τREF is a rate of the period τ3 during one cycle.

During the period of τ3, the bit line potential is maintained at the ground potential which is the same as the source potential, and the word line potential is held at a load potential VWL_hold lower than any one of the source potential, the bit line potential, and the body potential. Accordingly, current components other than IGIDL are substantially zero. However, because the word line potential is maintained at the deep negative potential VWL_hold, the GIDL current IGIDL3 flows to the body 50. As a result, as shown at t11 and after, the body potential increases along time. Because the body potential of each "0" cell is lower than the body potential of each "1" cell, the current IGIDL3 of each "0" cell is larger than that of each "1" cell. Therefore, a body potential difference between the "0" cell and the "1" cell gradually decreases. This leads to a degradation of the signal difference at the reading time. To solve this problem, first and second refresh operations are repeatedly performed. By repeatedly performing the first and second refresh operations, body potentials of the "0" cells and the "1" cells converge to the stationary points Vb0 and Vb1 shown in FIG. 4, respectively. The stationary points Vb0 and Vb1 are in a state that the amount of current Iin flowing to the body 50 within one cycle τref of the refresh operation becomes substantially equal to the amount of current Iout flowing to the body 50 during one cycle τref of the refresh operation.

During the "0" refresh period τ1, the "1" refresh period τ2, and the data holding period τ3, the body potential Vbody is different based on a capacitance coupling between the body 50 and the node of each word line WL and each bit lines BL. When a shift amount of the body potential Vbody is ΔVbody, this ΔVbody is attributable to the capacitance coupling between the node and the body 50, and is different from a change of the body potential based on the number of holes within the body 50. Therefore, the body potential Vbody needs to be shifted by ΔVbody when the time shifts from the refresh period τ1 or τ2 to the data holding period τ3, or when the time shifts from the data holding period τ2 to the refresh period τ1 or τ2.

To obtain the curve shown in FIG. 4, either a curve showing a relationship between the body current $<(\text{Iin}-\text{Iout})_{NET}>$ and the body voltage Vbody during the refresh periods τ1 and τ2 or a curve showing a relationship between the body current $<(\text{Iin}-\text{Iout})_{NET}>$ and the body voltage Vbody during the data holding period τ3 needs to be shifted by ΔVbody, and then both curves need to be added together. For example, when the body potential changes by −ΔVbody (negative value) after the "0" refresh operation shifts to the data holding state, the curve of the "0" refresh period is shifted in parallel by −ΔVbody, and the curve moved in parallel is added with the curve of the data holding period. Further, when the body potential changes by −ΔVbody (negative value) after the "1" refresh operation shifts to the data holding state, the curve of the "1" refresh period is shifted in parallel by −ΔVbody, and the curve moved in parallel is added with the curve of the data holding period. That is, $<(\text{Iin}-\text{Iout})_{NET}>$ in the equation 1 is a result of moving $<(\text{Iin1}-\text{Iout1})_{NET}>$ and $<(\text{Iin2}-\text{Iout2})_{NET}>$ in parallel by −ΔVbody, and then adding a parallel-moved result to $<(\text{Iin3}-\text{Iout3})_{NET}>$. A horizontal axis shown in FIG. 4 becomes a body potential during the data holding period. Alternately, the curve of the data holding period can be moved in parallel by +ΔVbody, while fixing the curve of the "0" refresh period or the "1" refresh period.

As shown in FIG. 4, $<(\text{Iin}-\text{Iout})_{NET}>$ becomes zero at three different body potentials Vbo, Vbc, and Vb1. The body potentials Vbo, Vbc, and Vb1 are stationary points, because the amount of current (the number of holes) flowing to the body 50 is substantially equal to the amount of current (the number of holes) flowing out from the body 50. However, as described above, Vbc is an unstable stationary point. This is because when the body potential Vbody is deviated by a fine potential from Vbc due to noise or the like, this deviation is amplified, and the body potential Vbody changes to a direction apart from Vbc. On the other hand, Vb0 and Vb1 are stable stationary points. This is because even when the body potential Vbody is deviated from Vb0 or Vb1, the body potential Vbody converges to Vb0 or Vb1 so long as the body potential Vbody does not exceed Vbc. That is, the stable stationary points Vb0 and Vb1 can be used to show a data polarity (0 or 1). The unstable stationary point Vbc can be used as a boundary point between the data "0" and the data "1".

When the stable stationary points Vb0 and Vb1 are used as the data "0" and the data "1", the data "0" and the data "1" can be recovered to the stable stationary points Vb0 and Vb1, by applying an equal word line voltage and an equal bit line voltage to all memory cells in the refresh operation. That is, all memory cells of the memory cell arrays can be autonomously refreshed. However, when the "0" cells and the "1" cells are excessively degraded, and also when the body potential Vbody exceeds the unstable stationary point Vbc, polarities of the data in the memory cells MCs are inverted. Therefore, the autonomous refresh operation needs to be performed to the "1" cells and the "0" cells before the body potential Vbody of the "1" cells or the "0" cells exceeds the unstable stationary point Vbc due to the degradation of the "1" cells or the "0" cells.

The FBC memory device according to the first embodiment can autonomously recover each data state of each memory cell MC by the autonomous refresh. Therefore, the sense amplifier does not need to perform the conventional refresh operation of reading the data of the memory cell MCs and restoring the data to the original memory cells MCs. Because the sense amplifier S/A does not need to read data, the FBC memory device can simultaneously refresh plural memory cells MCs connected to bit lines of a certain column. Further, the autonomous refresh according to the first embodiment can refresh both the "0" cells and the "1" cells in a state that the voltages of the whole word lines WLs are set substantially equal, and the voltages of the whole bit lines BLs are set substantially equal. Therefore, the autonomous refresh according to the first embodiment can collectively refresh the whole memory cells within the memory cell arrays.

Figure 13:
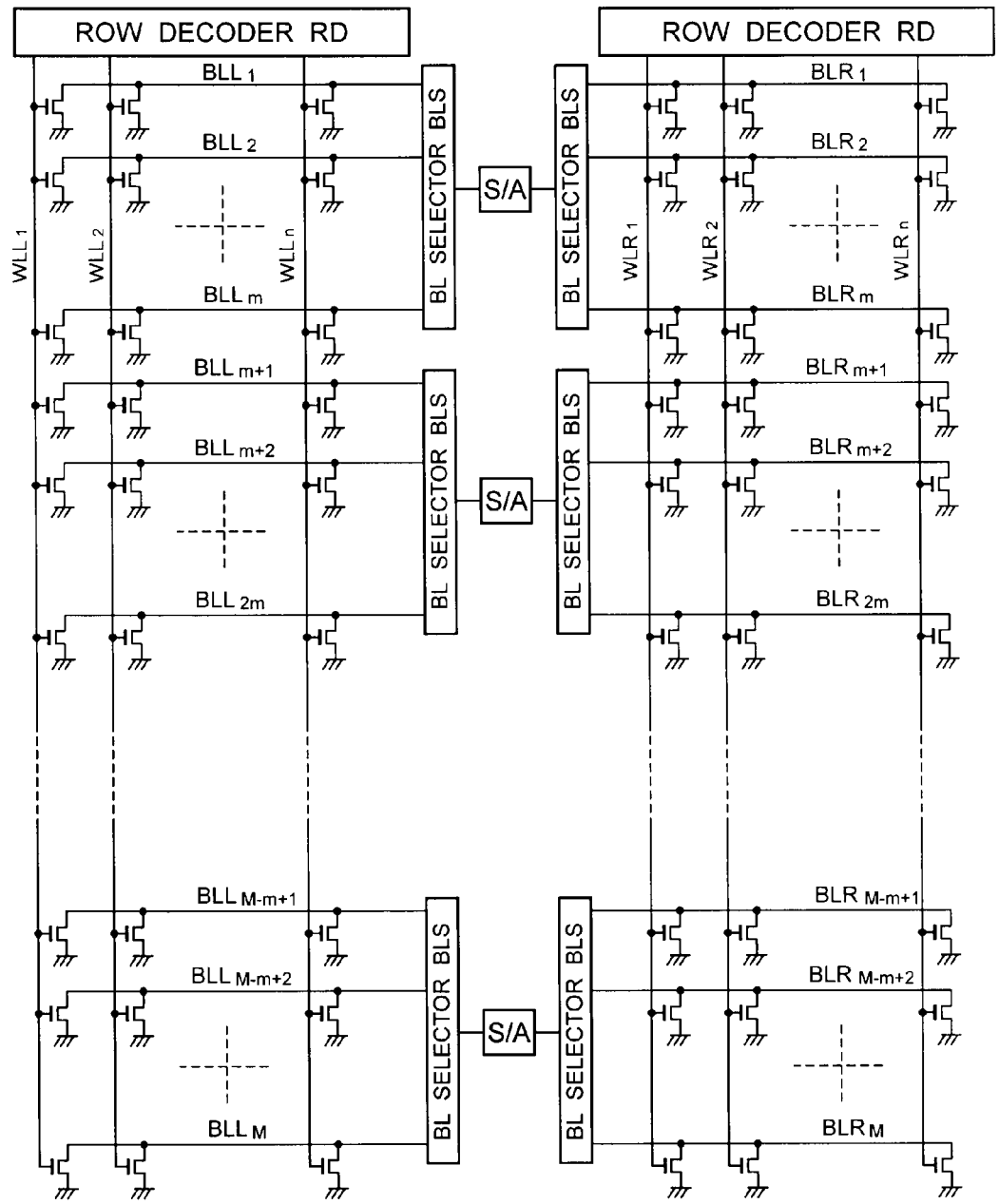
FIG. 13 shows one example of a configuration of an FBC memory device according to a ninth embodiment of the present invention.
Figure 14:
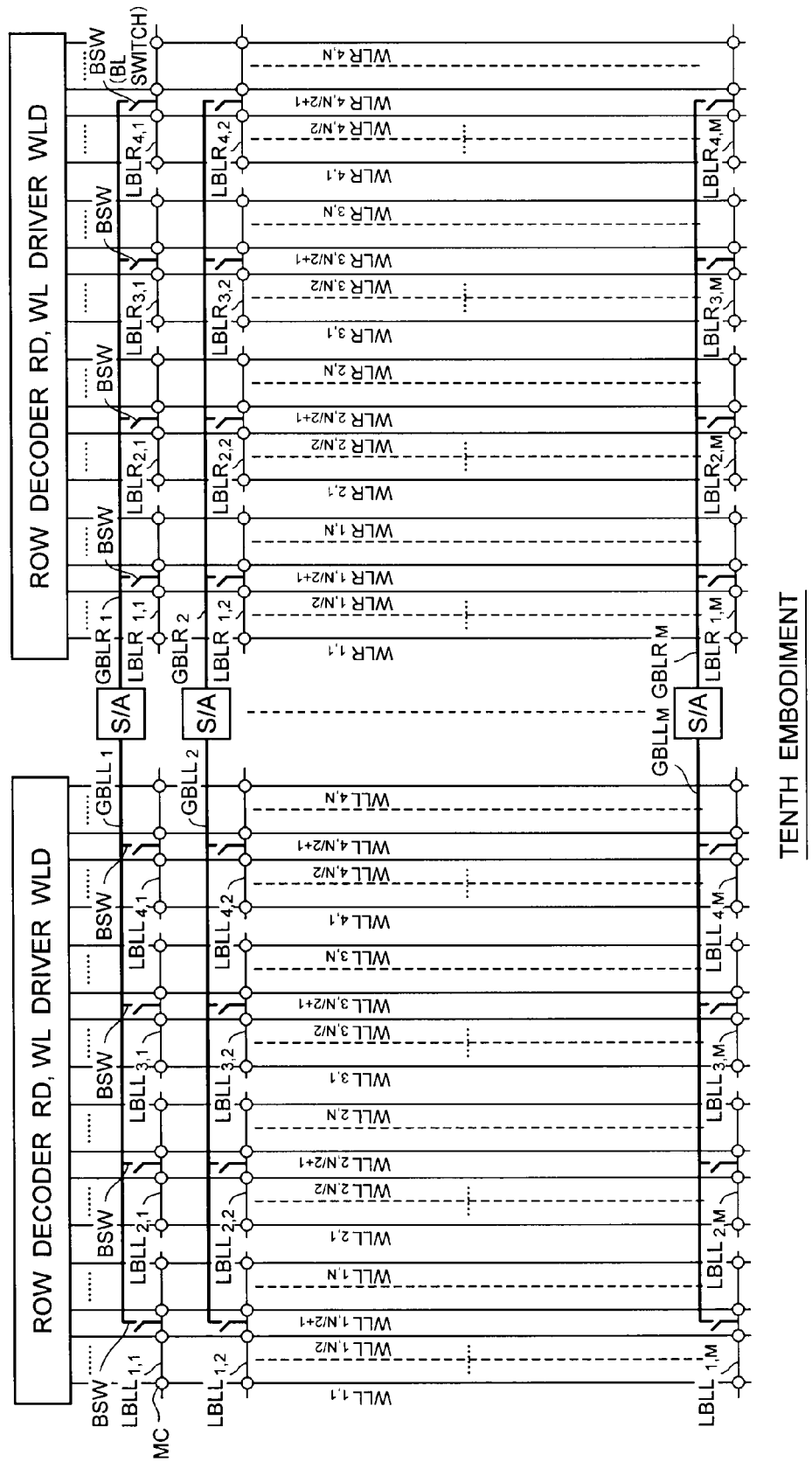
FIG. 14 shows one example of a configuration of an FBC memory device according to a tenth embodiment of the present invention.

The autonomous refresh according to the first embodiment can substantially increase the number of memory cells that can be refreshed once as compared with the conventional refresh. Therefore, the current necessary to charge the bit lines BLs can be substantially decreased, and a refresh busy rate can be decreased substantially. Because the number of sense amplifiers S/As can be decreased as shown in FIGS. 13 and 14, chip sizes can be decreased. That is, the FBC memory device according to the first embodiment has a small refresh busy rate, consumes a small amount of current at the data holding time, and is excellent in downsizing.

In the first embodiment, the autonomous refresh can be performed to collectively refresh the whole memory array. However, the number of the word lines WLs and the number of the bit lines BLs simultaneously activated may be limited in a certain design. That is, the memory cell array may be refreshed partly (for each block) in that design.

In the refresh cycle τref according to the first embodiment, both or either one of the "0" refresh operation and the "1" refresh operation can be performed by a plural number of times. For example, when the degradation of the "0" cells is excessive, the "0" refresh operation can be performed by a plural number of times, and the "1" refresh operation can be performed once.

In the first embodiment, the refresh operation is performed by driving the potential of each bit line BL. However, the refresh operation can be performed by driving the source potential in place of the potential of the bit line BL. In this case, during the "1" refresh period τ2, impact ionization is generated by increasing the source potential to a higher level potential than the potential of the bit line BL.

The word line potential VWL_ref0 during the "0" refresh period τ1 can be higher than the bit line potential VBL_ref during the "0" refresh period τ2. By increasing the word line potential VWL_ref0, electron density within the inverted layer becomes high. Therefore, at t3, the number of electrons supplied from the channel is considered to increase. As a result, holes within the body 50 can be discharged more effectively.

The refresh cycle in the first embodiment includes three states of the "0" refresh operation, the "1" refresh operation, and the data holding state. However, the refresh cycle can include four or more states. In this case, the body current $<(\text{Iin}-\text{Iout})_{NET}>$ of the equation 1 becomes a summation of the body currents of each state.

Second Embodiment

Figure 6:
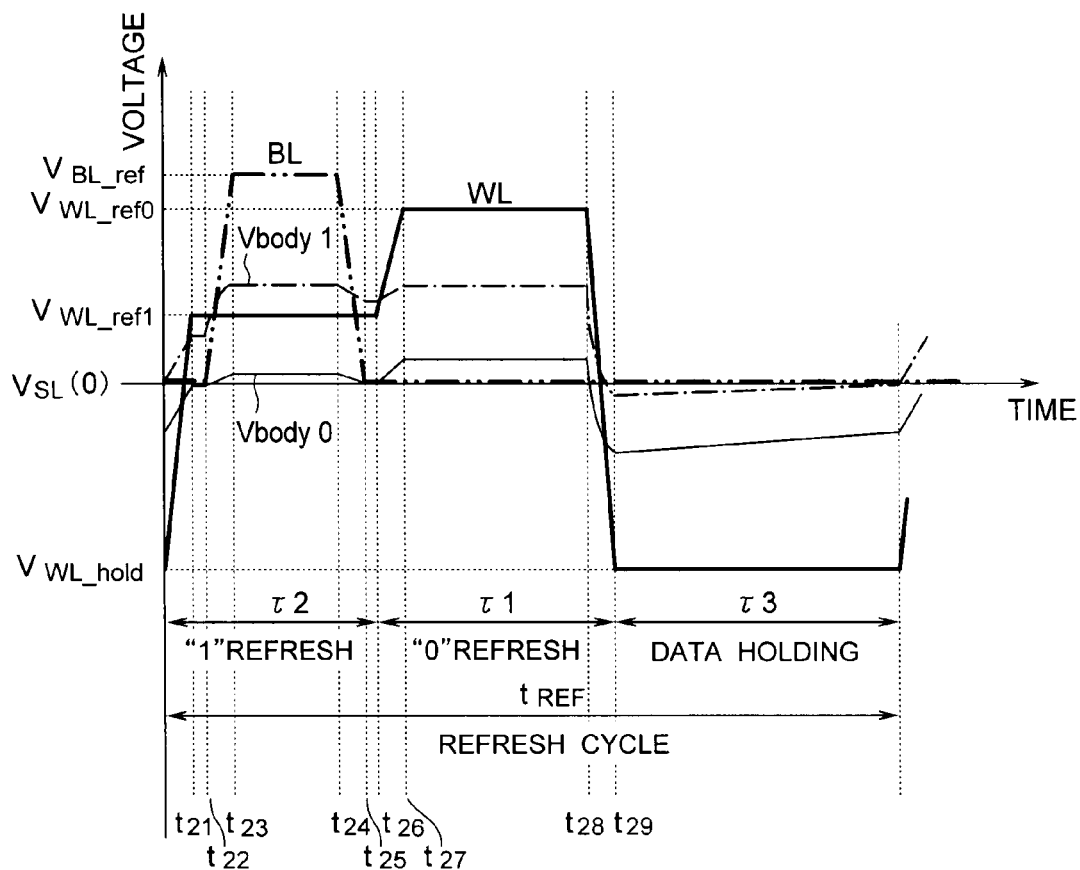
FIG. 6 is a timing diagram showing an autonomous refresh operation according to a second embodiment of the present invention.

FIG. 6 is a timing diagram showing an autonomous refresh operation according to a second embodiment of the present invention. The configuration of an FBC memory device according to the second embodiment can be identical to that of the first embodiment. The second embodiment is different from the first embodiment in that the "1" refresh operation is performed first (t21 to t25), and thereafter, the "0" refresh operation is performed (t25 to t29) without returning the word line potential to the data holding state. After the "0" refresh operation is performed, the word line potential is returned to the data holding state.

The word line potential and the bit line potential in the "1" refresh operation can be identical to those of the first embodiment. The word line potential and the bit line potential in the "0" refresh operation can be identical to those of the first embodiment. That is, the "1" refresh operation and the "0" refresh operation are identical to those of the first embodiment. The explanation of the body current $<(\text{Iin}-\text{Iout})_{NET}>$ and the equation 1 to the equation 4 explained in the first embodiment can be similarly applied to the second embodiment except that ICP2 and Ich2 in Equation 3 are eliminated. The graph showing the relationship between the body potential and the body current shown in FIG. 4 can be also applied to the second embodiment.

The "1" refresh operation is first performed, and thereafter, the "0" refresh operation is performed. With this arrangement, the data holding state does not need to be provided between the "1" refresh operation and the "0" refresh operation. This is for the following reason. In the "0" refresh operation, to generate the charge pumping phenomenon and to supply electrons from the channel, the word line potential needs to be decreased to the data holding state VWL_hold, after the word line potential is increased to VWL_ref0. However, the impact ionization in the "1" refresh operation does not require the decrease the word line potential. In the "0" refresh operation, during t28 to t29, the charge pumping phenomenon is generated and electrons are supplied from the channel, by decreasing the word line potential to the data holding state VWL_hold. Because the data holding state does not need to be provided between the "1" refresh operation and the "0" refresh operation as explained above, the refresh cycle tREF can be a short period. Degradation of the "1" cells by the charge pumping phenomenon can be restricted by performing the "1" refresh operation prior to the "0" refresh operation. Charge and discharge currents of the word lines WLs can be decreased, and this has an effect of low power consumption. Further, the second embodiment can also achieve the effects of the first embodiment.

Third Embodiment

Figure 7:
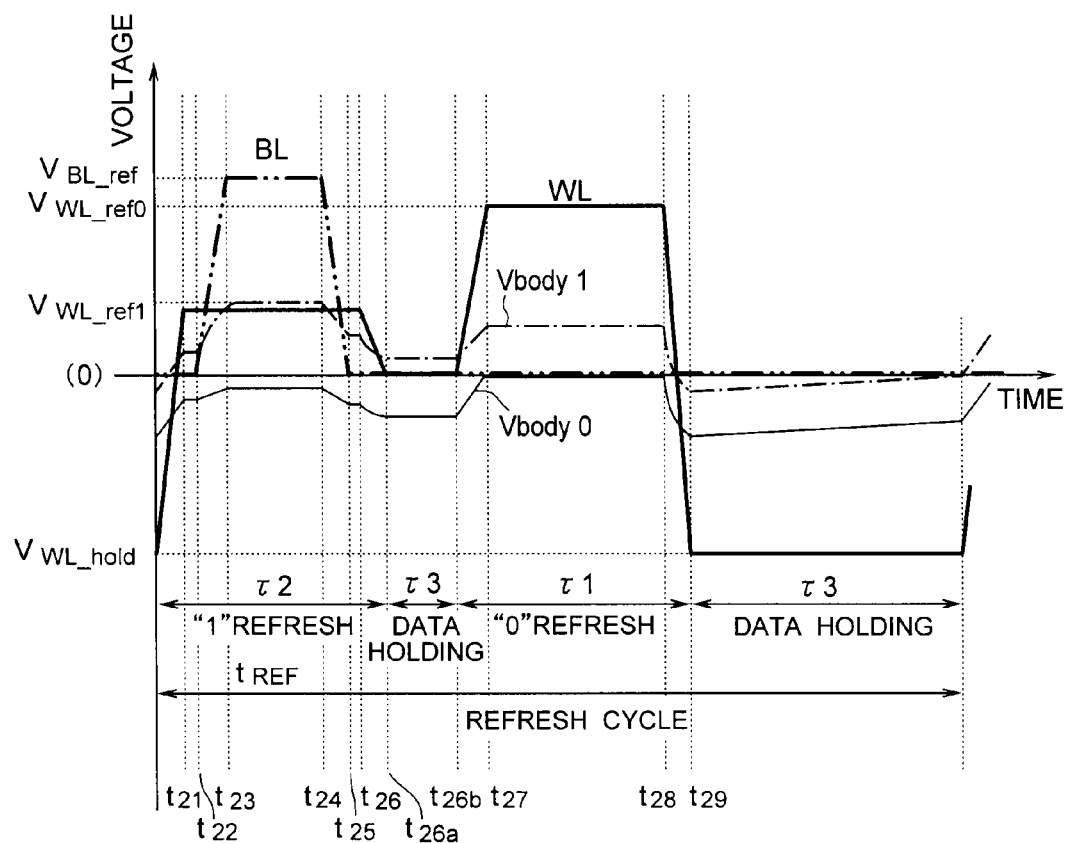
FIG. 7 is a timing diagram showing an autonomous refresh operation according to a third embodiment of the present invention.

FIG. 7 is a timing diagram showing an autonomous refresh operation according to a third embodiment of the present invention. The configuration of an FBC memory device according to the third embodiment can be identical to those of the first and second embodiments. The third embodiment is different from the second embodiment in that the "1" refresh operation is performed first, thereafter, the word line potential is once set to a level (for example, a source potential) higher than VWL_hold and lower than VWL_ref1 (t26a to t26b), and thereafter, the "0" refresh operation is performed. After the "0" refresh operation is performed, the word line potential is returned to the data holding state. Other operations of the third embodiment can be identical to those of the second embodiment.

Even when the word line potential is once set equal to the source potential after the "1" refresh operation is performed, the charge pumping phenomenon and the supply of electrons from the channel are not generated in the "1" cells. Therefore, the data holding state can be provided between the "1" refresh operation and the "0" refresh operation. Accordingly, the third embodiment can achieve the effects of the second embodiment.

Fourth Embodiment

Figure 8:
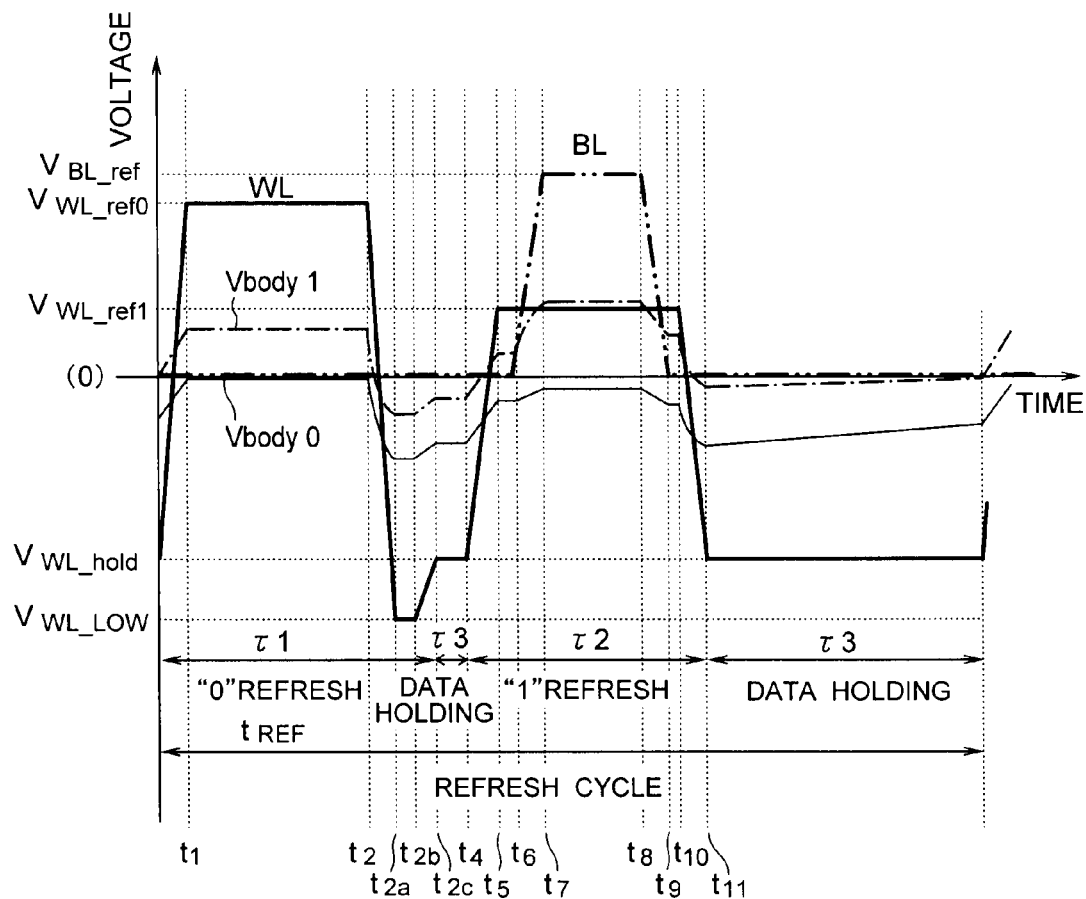
FIG. 8 is a timing diagram showing an autonomous refresh operation according to a fourth embodiment of the present invention.

FIG. 8 is a timing diagram showing an autonomous refresh operation according to a fourth embodiment of the present invention. The configuration of an FBC memory device according to the fourth embodiment can be identical to that of the first embodiment. The fourth embodiment is different from the first embodiment in that after the "0" refresh operation is performed, the word line potential is decreased for only a short time to a negative potential VWL_Low much lower than the potential VW_hold in the data holding state (t2a to t2c). After the word line potential is decreased to the negative potential VWL_Low, the "1" refresh operation is performed, and the word line potential is returned to the data holding state. Other operations of the fourth embodiment can be identical to those of the first embodiment.

In the "0" refresh operation, after the word line potential is increased, this potential is decreased to the very low potential VWL_Low. With this arrangement, holes can be vanished effectively, by the charge pumping phenomenon and the electrons supplied from the channel. The fourth embodiment can also achieve the effects of the first embodiment.

Fifth Embodiment

Figure 9:
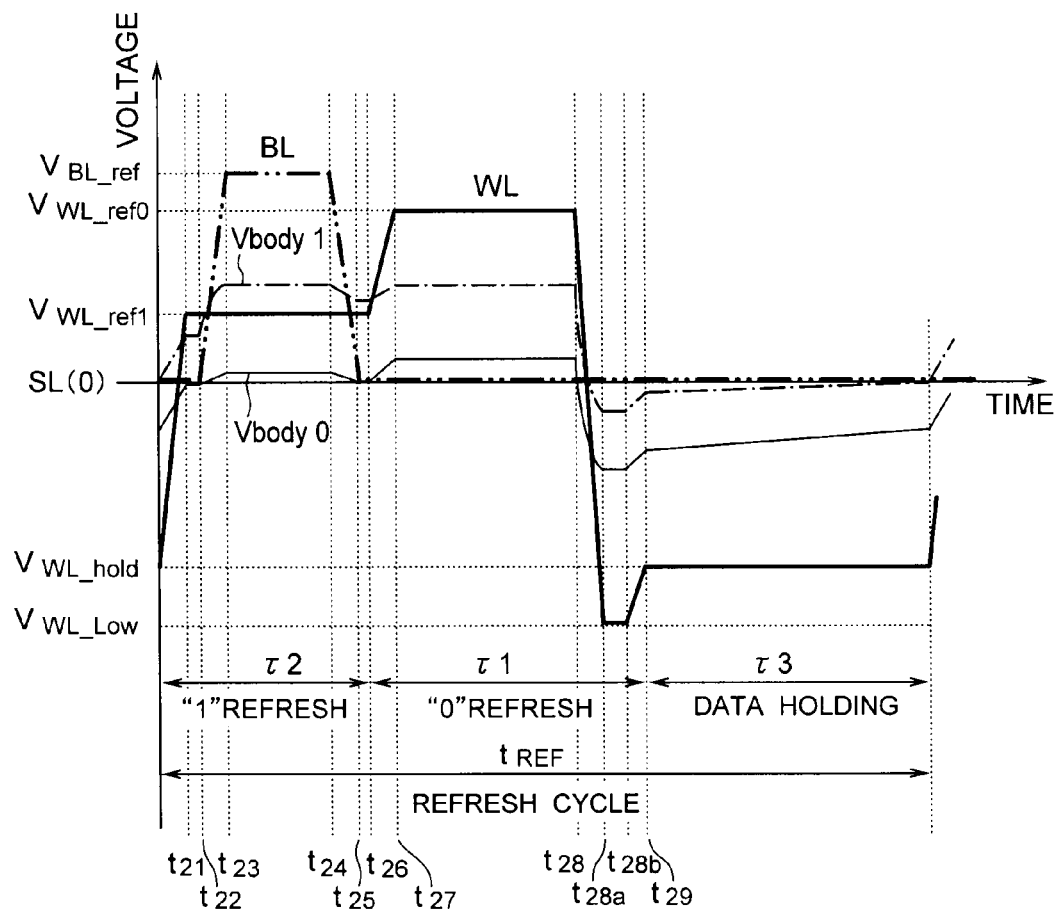
FIG. 9 is a timing diagram showing an autonomous refresh operation according to a fifth embodiment of the present invention.

FIG. 9 is a timing diagram showing an autonomous refresh operation according to a fifth embodiment of the present invention. The fifth embodiment is a combination of the second embodiment and the fourth embodiment. The configuration of an FBC memory device according to the fifth embodiment can be identical to that of the first embodiment. That is, the fifth embodiment is different from the fourth embodiment in that the "1" refresh operation is performed first, and thereafter, the "0" refresh operation is performed without returning the word line potential to the data holding state. Further, the fifth embodiment is different from the second embodiment in that after the "0" refresh operation is performed, the word line potential is decreased for only a short time to the negative potential VWL_Low much lower than the potential VW_hold in the data holding state (t28a to t28c). After the word line potential is decreased to the negative potential VWL_Low, the word line potential is returned to the data holding state.

In the "0" refresh operation, after the word line potential is increased, this potential is decreased to the very low potential VWL_Low. With this arrangement, holes can be vanished effectively, by the charge pumping phenomenon and the electrons supplied from the channel. The data holding state does not need to be provided between the "1" refresh operation and the "0" refresh operation. Accordingly, the fifth embodiment can achieve both effects of the second and fourth embodiments.

Sixth Embodiment

Figure 10:
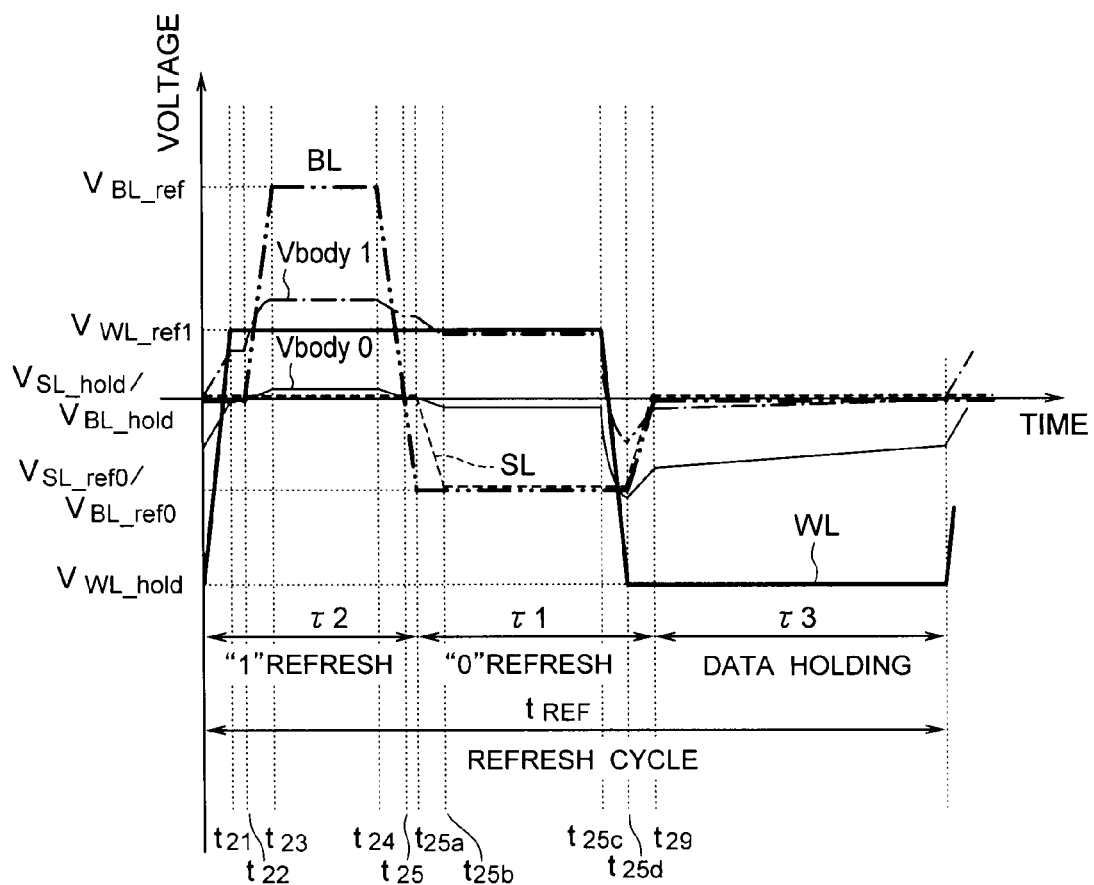
FIG. 10 is a timing diagram showing an autonomous refresh operation according to a sixth embodiment of the present invention.
Figure 12:
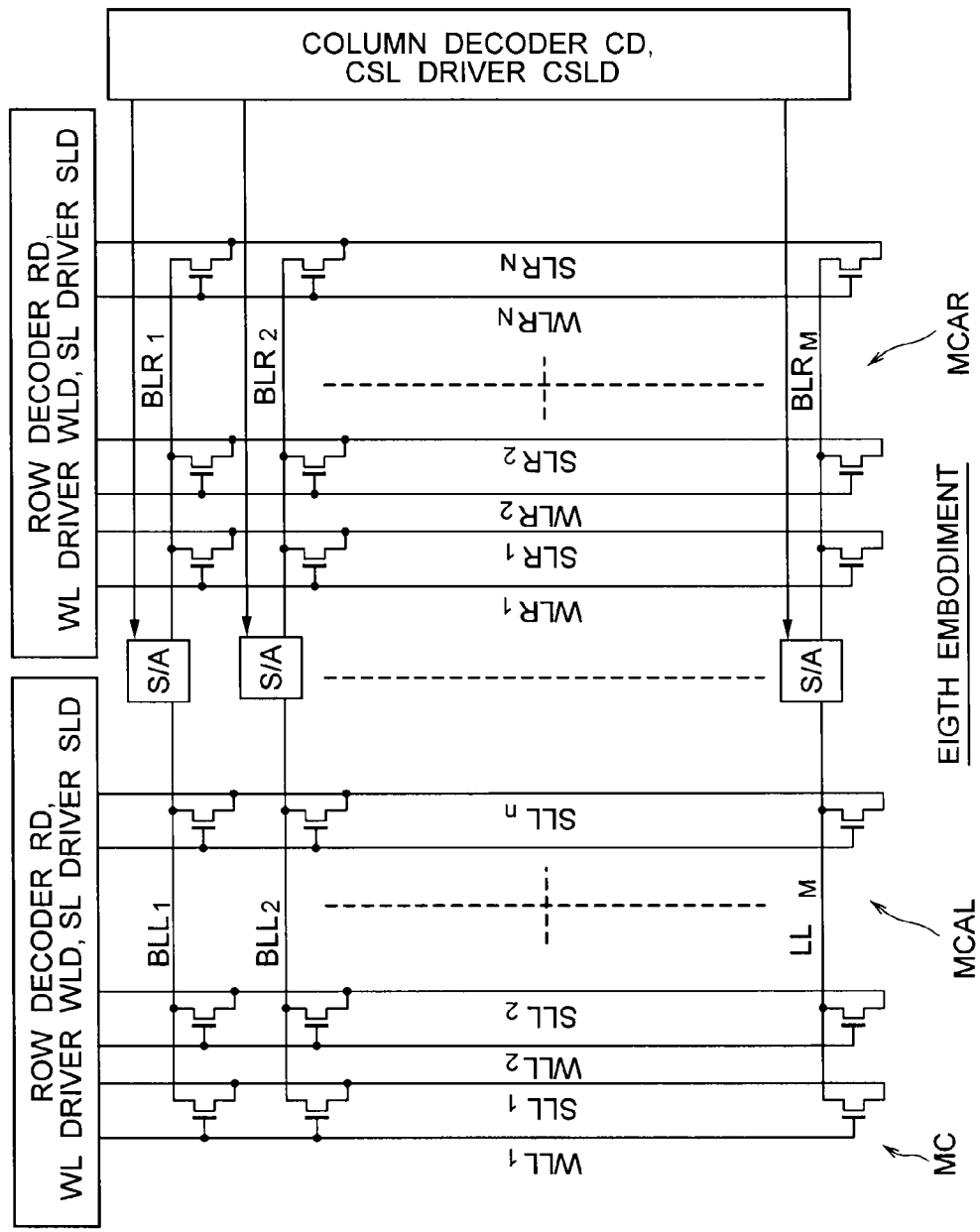
FIG. 12 shows one example of a configuration of an FBC memory device according to an eighth embodiment of the present invention.

FIG. 10 is a timing diagram showing an autonomous refresh operation according to a sixth embodiment of the present invention. The sixth embodiment is different from the second embodiment in that in the "0" refresh operation, the source potential and the bit line potential are changed without changing the word line potential. Other operations of the sixth embodiment can be identical to those of the second embodiment. For this embodiment, the cell array architecture is shown in FIG. 12 instead of FIG. 1.

Unlike in the second embodiment, after the "1" refresh operation is performed, the bit line potential is decreased to the negative potential VB_ref0 at t25a, and the source potential is decreased to the negative potential VSL_ref0 at t25b. With this arrangement, in the "1" refresh and the "0" refresh, while the word line potential is constant, a potential difference between the VWL_ref0 and the source potential VSL in the "0" refresh becomes larger than a potential difference between VWL_ref1 and the source potential VSL in the "1" refresh. The potentials VB_ref0 and VSL_ref0 are substantially equal. The potentials VB_ref0 and VSL_ref0 can be equal to the potentials VB_hold and VSL_hold. In this case, while the charge pumping current decreases in the "0" refresh, the effect of the sixth embodiment is not lost when the equation 1 is established.

The potentials VB_ref0 and VSL_ref0 are decreased by the increase of the word line potential at t26 to t27 shown in FIG. 6 That is, the potentials VB_ref0 and VSL_ref0 become a level of the potential (the ground potential) in the data holding state decreased by −(VWL_ref0−VWL_ref1). In the sixth embodiment, a potential difference between the word lines and the bit lines and a potential difference between the word lines and the source become identical to those of the second embodiment. Accordingly, channels (inverted layers) are formed in both the "0" cells and the "1" cells, and electrons are sufficiently trapped in the surface state present on the interface between silicon and the gate dielectric film.

During t25c and t29, the word line potential is returned to the potential VWL_hold, and the bit line potential and the source potential are returned to the potential (the ground potential) in the data holding state. In this case, the charge pumping phenomenon is generated and electrons are supplied from the channel, and the "0" refresh operation is performed.

When the source potential and the bit line potential are driven like that in the sixth embodiment, amplitude of the word line potential can be decreased. The sixth embodiment can achieve the effects of the second embodiment.

Similarly, in the first to sixth embodiments, the effect of each embodiment can be obtained by driving the source potential. For example, in the "0" refresh operation, the source potential and the bit line potential can be decreased instead of increasing the word line potential. In the "1" refresh operation, the impact ionization can be generated by applying a high level potential to the source instead of the bit line.

Seventh Embodiment

A seventh embodiment relates to an autonomous refresh operation in an active mode. The first to sixth embodiments have explained the autonomous refresh operation in the data holding mode having no access of writing data from the outside or reading data to the outside during a constant period or more period. The body currents Iin and Iout of the autonomous refresh operation in the active mode that a period from an access to the next access is shorter than the constant period are larger than the body currents Iin and Iout of the autonomous refresh operation in the data holding mode.

Figure 11:
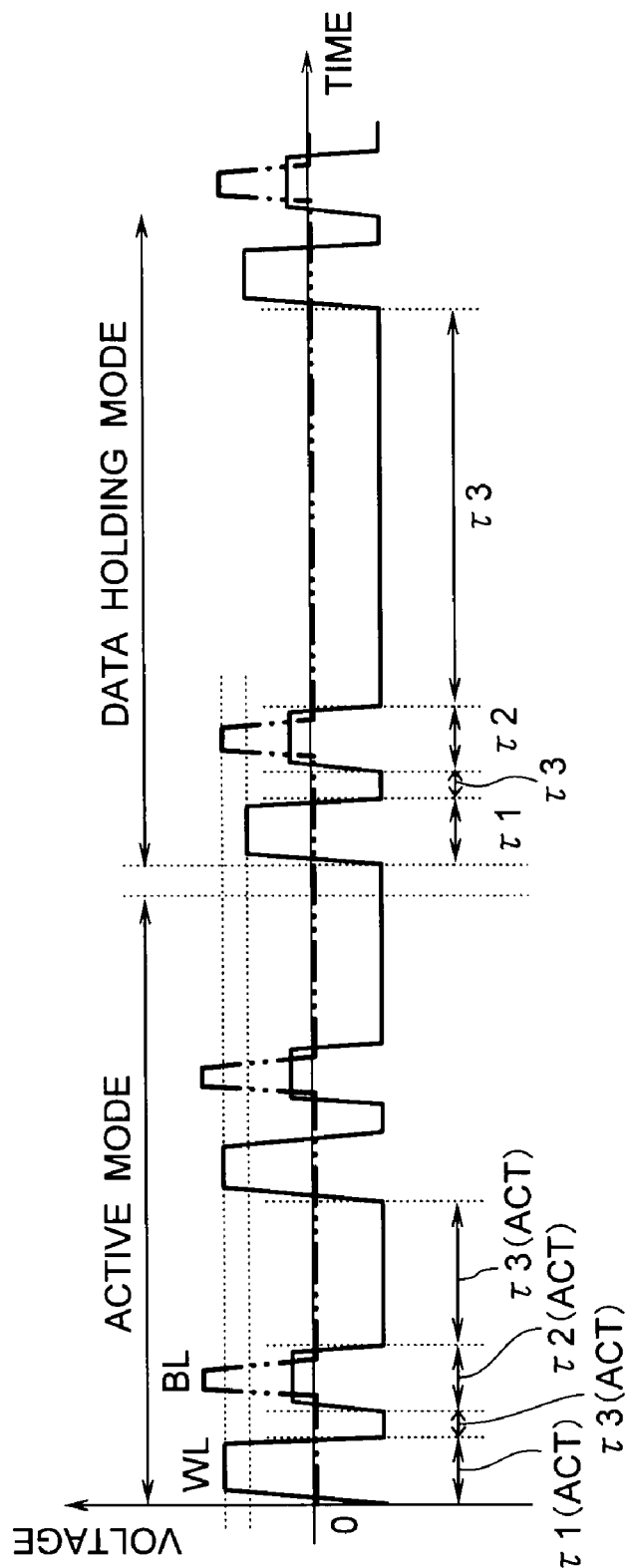
FIG. 11 is a timing diagram of the word line potential and the bit line potential in the active mode and the data holding mode in the seventh embodiment.

FIG. 11 is a timing diagram of the word line potential and the bit line potential in the active mode and the data holding mode in the seventh embodiment. As shown in FIG. 11, the body currents Iin and Iout of the data holding mode are smaller than the body currents Iin and Iout of the active mode.

At the time of performing the autonomous refresh in the active mode, the influence of disturbance to the memory cells MCs due to writing from the outside or due to a reading to the outside is concerned. When this disturbance can be disregarded, a restore operation is performed for each access. Therefore, in the active mode, the autonomous refresh can be performed in the same cycle and in the same voltage condition as those of the data holding mode.

However, when this disturbance cannot be disregarded, the balance of a current component of the body current is broken. In this case, a current component necessary for the autonomous refresh is increased by increasing the word line potential and the bit line potential. For example, in the "0" refresh operation (τ1 (ACT)), the charge pumping current ICP1 and the current Ich1 based on electrons supplied from the channel shown in the equation 2 can be increased by increasing the word line potential. In the "1" refresh operation (τ2 (ACT)), the impact ionization current Iii2 shown in the equation 3 can be increased by increasing the bit line potential. Accordingly, a current component of the disturbance in the body current becomes relatively small, and the unbalance of the current component of the body current is suppressed. When the balance of the current component of the body current is improved, deviation from either the stationary point Vb0 or Vb1 shown in FIG. 4 becomes small, and degradation of data can be suppressed.

Alternatively, in the active mode, a pulse width of the word line potential and the bit line potential in the autonomous refresh operation can be set longer than that in the data holding mode. Also in this case, the above effect is not lost.

The seventh embodiment can be applied to any of the first to sixth embodiments.

Eighth Embodiment

FIG. 12 shows one example of a configuration of an FBC memory device according to an eighth embodiment of the present invention. The FBC memory device according to the eighth embodiment is provided corresponding to the word lines WLs, and further includes source lines SLL1 and SLLn, and SLR1 to SLRn (hereinafter, collectively called SLs) extending along the word lines WLs, and an SL driver SLD driving the source lines SLs. Other configurations of the eighth embodiment can be identical to those of the first embodiment. Further, operations of the eighth embodiment can be identical to those of any of the first to seventh embodiments. Accordingly, the eighth embodiment can achieve effects of any of the first to seventh embodiments.

The array configurations shown in FIGS. 1 and 12 can be applied to what is called a single cell (one cell/bit) or twin cells (two cells/bit). According to the single-cell system, in the data read/write operations, one of the bit line pair BLL and BLR connected to both sides of each sense amplifier S/A transmits data of the memory cells MCs, and the other passes the reference current Iref. The reference current Iref is substantially an intermediate current between a current flowing to the "0" cells and a current flowing to the "1" cells. To generate the reference current Iref, dummy cells, dummy word lines, averaging circuits, and dummy writing circuits become necessary, but these are omitted here. Each sense amplifier S/A passes a current to the memory cells MCs via one of the bit lines BLs. With this arrangement, a current corresponding to the data of the memory cells MCs flows through the sense node within the sense amplifier S/A. The sense amplifier S/A identifies the logic value "1" or "0", based on whether the current flowing through the sense node is higher or lower than the reference current Iref.

According to the twin-cell system, data of one of the bit line pair BLL and BLR connected to both sides of each sense amplifier S/A can be set as the reference data of the other data, and the other data can be set as the reference data of the one data. In this case, the two selection memory cells connected to the bit line pair BLL and BLR need to store mutually complementary data (the data "1" and the data "0"). That is, the two memory cells store one bit.

Ninth Embodiment

FIG. 13 shows one example of a configuration of an FBC memory device according to a ninth embodiment of the present invention. In the ninth embodiment, each sense amplifier S/A is provided for each m (m≧2) bit lines BLs. A bit line selector BLS is provided between the sense amplifier S/A and the m bit lines BLs. In the data read/write operations, the bit line selector BLS is configured to select a specific bit line BL from the m bit lines BLs and connects this bit line BL to the sense amplifier S/A. On the other hand, in the refresh operation, the bit line selector BLS can connect all the m bit lines BLs to the sense amplifier S/A. With this arrangement, the FBC memory device according to the ninth embodiment can perform the autonomous refresh operation in a similar manner to that in the first to eighth embodiments.

In the ninth embodiment, because each sense amplifier S/A is provided for each m bit lines, area of the peripheral circuits other than the memory cells can be decreased. That is, a rate of cells occupied in the memory chip is improved. Accordingly, a chip size in the FBC memory device can be decreased.

Tenth Embodiment

FIG. 14 shows one example of a configuration of an FBC memory device according to a tenth embodiment of the present invention. In the tenth embodiment, each bit line is divided into local bit lines LBLLk, i, LBLRk, i (k is 1 to 4, and i is 1 to M) (hereinafter, also simply called LBLs), and global bit lines GBLLi and GBLRi (hereinafter, also simply called GBLs). Each local bit line LBL is connected to many memory cells out of the memory cells MCs of a certain column. In FIG. 14, N memory cells MCs are connected to one local bit line LBL. The global bit lines GBLs are provided corresponding to plural local bit lines, and are connected to each sense amplifier S/A.

A bit line switch BSW is connected to each local bit line LBL and each global bit line GBL. Each global bit line GBL can be selectively connected to a specific local bit line LBL by the bit line switch BSW.

According to a hierarchical bit line configuration shown in FIG. 14, the sense amplifier S/A does not need to be provided for each local bit line LBL, and the number of the sense amplifiers S/A can be decreased. For example, in the example shown in FIG. 14, the global bit lines GBLs are connected to left and right sides of the sense amplifier S/A, and each global bit line GBL is connected to four local bit lines LBLs (eight local bit lines in total). Therefore, in the tenth embodiment, the number of the sense amplifiers S/As becomes one eighth of the number of the sense amplifiers S/As that are provided for each local bit line LBL.

When the conventional refresh operation is performed in this hierarchical bit line configuration, the number of memory cells that can be refreshed at once can be decreased to one eighth. Therefore, the number of refresh cycles (the number of refresh cycles necessary to refresh the whole memory cells) becomes large, and a refresh busy rate becomes large.

On the other hand, when the autonomous refresh according to the tenth embodiment is used, memory cells of the total memory cell array can be collectively refreshed irrespectively of the number of sense amplifiers. Therefore, according to the autonomous refresh, the FBC memory device employing the hierarchical bit line configuration can refresh the whole memory cells without increasing the refresh busy rate. Further, by employing the hierarchical bit line configuration, the number of the sense amplifiers S/As can be decreased. Therefore, a total size of the memory device can be decreased.

Eleventh Embodiment

Figure 15:
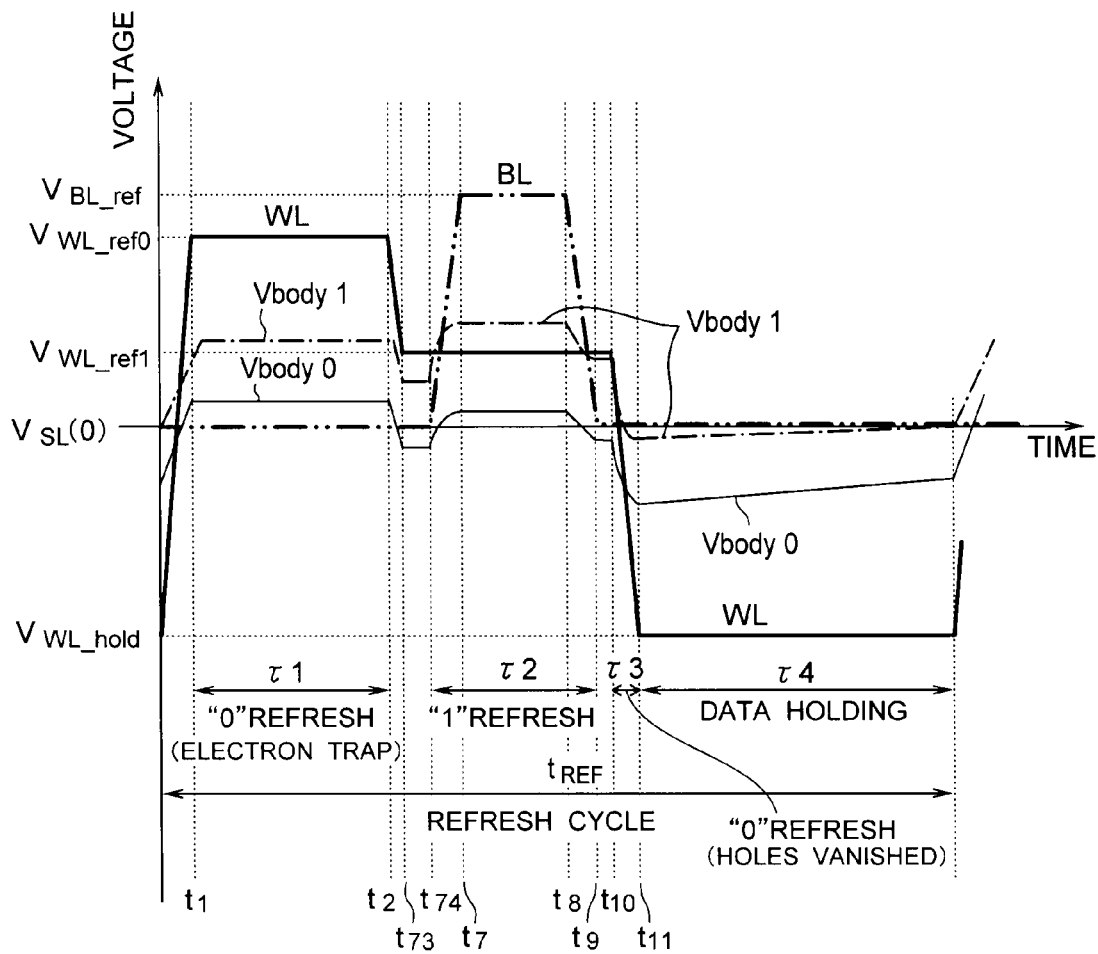
FIG. 15 is a timing diagram showing an autonomous refresh operation according to an eleventh embodiment of the present invention.

FIG. 15 is a timing diagram showing an autonomous refresh operation according to an eleventh embodiment of the present invention. The configuration of an FBC memory device according to the eleventh embodiment can be identical to that of the first embodiment.

The eleventh embodiment is different from the first embodiment in that the "0" refresh operation is divided into two.

Operations of the eleventh embodiment during t1 to t2 shown in FIG. 15 are equal to the operations in the first embodiment during t1 to t2 shown in FIG. 5. Accordingly, channels are formed in both the "0" cells and the "1" cells, and electrons are sufficiently trapped in the surface state present on the interface between the silicon and the gate dielectric film.

In the first embodiment, at t3, the potential of each word line WL is decreased to the word line potential VWL_hold in the data holding state. However, in the eleventh embodiment, at t73, the potential of each word line WL is decreased to VWL_ref1. That is, in the eleventh embodiment, the "1" refresh operation is started in the state that electrons are kept trapped at the interface between the silicon and the gate dielectric film. With this arrangement, in the eleventh embodiment, the word line potential does not need to be once decreased to the data holding potential VWL_hold before the "1" refresh operation.

At t74, the potential of each bit line BL is increased to VBL_ref. Operation of the eleventh embodiment during t7 and t11 is identical to that of the first embodiment during t7 and t11. However, during t10 and t11, in the eleventh embodiment, by decreasing the potential of each word line WL to the data holding potential VWL_hold, electrons trapped at the interface between the silicon and the gate dielectric film are recombined with holes within the body, and are vanished. As explained above, in the "0" refresh (the charge pumping phenomenon), electrons at the interface between the silicon and the gate dielectric film are trapped during t1 and t2, and further the holes within the body are recombined with the trapped electrons during t10 and t11. Thus, the "0" refresh operation is completed. This "0" refresh operation is generated not only in the "0" cells but also in the "1" cells. However, in the "1" cells, a large volume of holes are accumulated in the body by the impact ionization, during t7 and t8. The number of holes vanished by the trapped electrons is negligibly small as compared with the number of holes accumulated in the "1" cells. Therefore, the influence of the "0" refresh operation to the "1" cells is small.

In the eleventh embodiment, the "0" refresh is divided into the period τ1 of the electron trap and a hole vanishing period τ3. The "0" refresh operation is completed simultaneously with the decreasing of the potential of each word line WL to the data holding potential VWL_hold, after the "1" refresh operation. Accordingly, during t2 and t7, the potential of each word line WL does not need to be decreased to the data holding potential VWL_hold. Consequently, the period from t2 to t7 in the eleventh embodiment becomes shorter than the period from t2 to t7 in the first embodiment. That is, according to the eleventh embodiment, the refresh cycle can be made shorter than that of the first embodiment. The eleventh embodiment can also achieve the effects of the first embodiment.

Twelfth Embodiment

Figure 16:
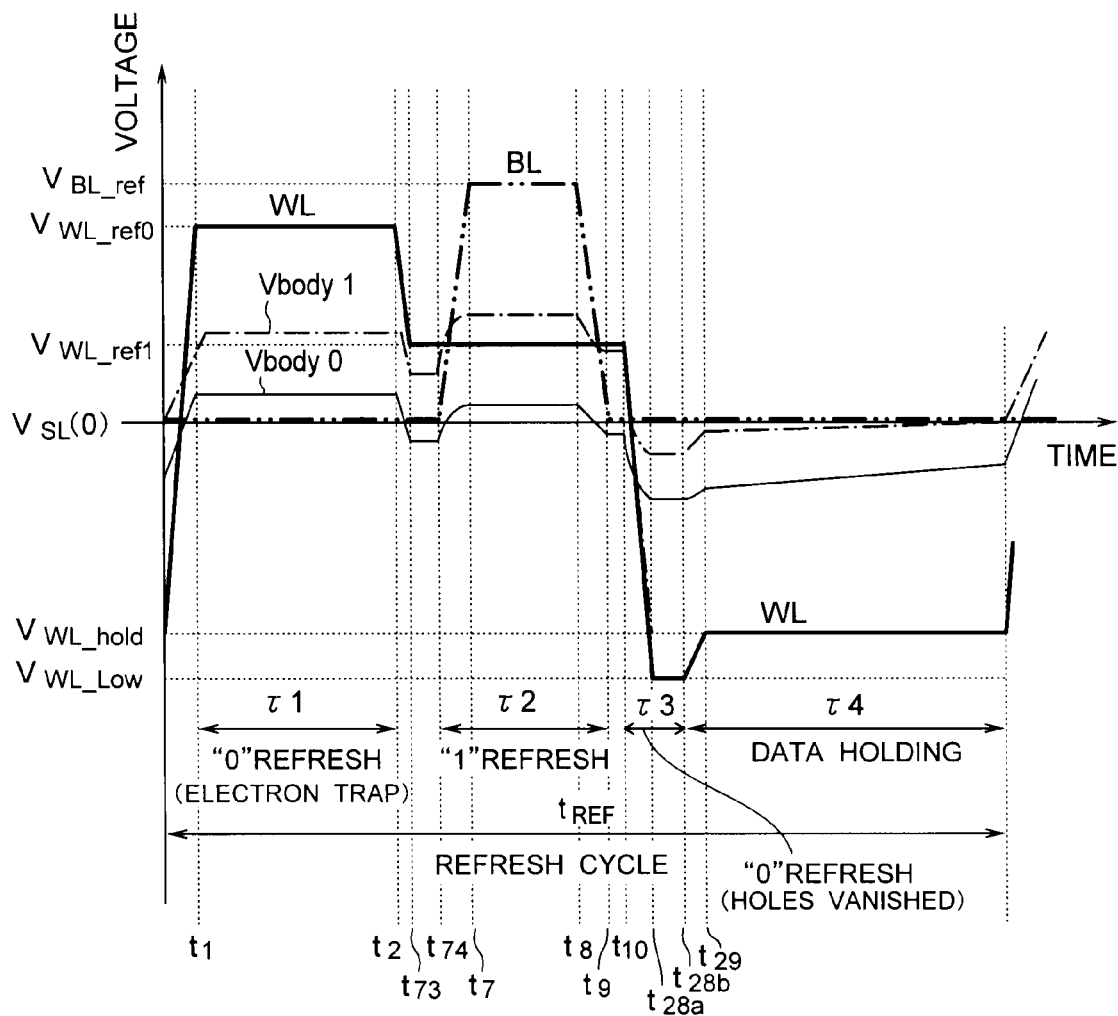
FIG. 16 is a timing diagram showing an autonomous refresh operation according to a twelfth embodiment of the present invention.

FIG. 16 is a timing diagram showing an autonomous refresh operation according to a twelfth embodiment of the present invention. The configuration of an FBC memory device according to the twelfth embodiment can be identical to that of the first embodiment. The twelfth embodiment is a combination of the eleventh embodiment and the ninth embodiment. The twelfth embodiment is different from the eleventh embodiment in that after the "1" refresh operation is performed, the word line potential is decreased for only a short time (t28$a$ to t28$b$) to the negative potential VWL_Low much lower than the potential VWL_hold in the data holding state. After the word line potential is decreased to the negative potential VWL_Low, the word line potential is returned to the data holding state.

Operation during t1 to t10 in the twelfth embodiment is equal to that during t1 to t10 in the eleventh embodiment.

After the "1" refresh operation, electrons trapped during t1 to t2 can be effectively vanished together with holes, by decreasing the word line potential to the very low potential VWL_Low. The twelfth embodiment can also achieve the effects of the eleventh embodiment.

In each of the above embodiments, the memory cells MCs can be p-FETs. In this case, the memory cells MCs accumulate electrons, or discharge electrons to store data. In this case, polarities of the word lines WLs and the bit lines BLs are inversed.

In the above embodiments, while the source potential is the ground potential, the source potential can be set to other potential than the ground potential. In this case, polarities of the potentials of the word lines WLs and the bit lines BLs are based on the source potential. The seventh to tenth embodiments can be combined to any of the first to sixth embodiments or to the eleventh and twelfth embodiments, respectively.

The invention claimed is:

1. A semiconductor memory device comprising:
   a semiconductor layer;
   a source layer and a drain layer provided within the semiconductor layer;
   a body region provided in the semiconductor layer between the source layer and the drain layer, the body region being in an electrically floating state, and the body region accumulating a charge or discharging a charge to store logic data;
   a gate dielectric film provided on the body region;
   a gate electrode provided on the body region via the gate dielectric film;
   a driver driving the gate electrode; and
   a sense amplifier sensing logic data from a memory cell including the source layer, the drain layer, and the body region, or writing logic data to the memory cell, wherein
   a refresh operation recovering degradation of logic data of the memory cell includes a first refresh operation and a second refresh operation,
   in the first refresh operation, a first potential higher than a potential of the gate electrode in a data holding state is applied to the gate electrode in a state having a potential substantially equal to a potential of the source layer applied to the drain layer, and thereafter a potential of the gate electrode in the data holding state is applied to the gate electrode, thereby a first current passes to the memory cell, and
   in the second refresh operation, a second potential higher than a potential of the gate electrode in the data holding state is applied to the gate electrode, and a third potential higher than a potential of the gate electrode in the data holding state is applied to the drain layer, thereby a second current passes to the memory cell, and
   a state of the memory cell is shifted to an equilibrium state in which an amount of the first current flowing during one cycle of the refresh operation becomes substantially equal to an amount of the second current flowing during one cycle of the refresh operation.

2. The semiconductor memory device according to claim 1, wherein
   a first amount of a charge based on the first current and a second amount of a charge based on the second current have two stable stationary points and one unstable stationary point, at which the first amount are equal to the second amount,
   potentials of the body region corresponding to the two stable stationary points are present at both sides of a potential of the body region corresponding to the one unstable stationary point, and
   one of the two stable stationary points is in an equilibrium state of the memory cell storing data "0", and the other is in an equilibrium state of the memory cell storing data "1".

3. The semiconductor memory device according to claim 1, wherein the first current is a charge pumping current or a current supplied from a channel, and the second current is an impact ionization current.

4. The semiconductor memory device according to claim 1, wherein within one cycle of the refresh operation, one of the first and the second refresh operations is performed by a plurality of times, or both the first and the second refresh operations are performed by a plurality of times.

5. The semiconductor memory device according to claim 1, wherein the second refresh operation is performed after the first refresh operation is performed, and thereafter a potential of the gate electrode and a potential of the drain layer are returned to the data holding states of the gate electrode and the drain layer, respectively.

6. The semiconductor memory device according to claim 1, wherein in the data holding state, a potential of the gate electrode is lower than a potential of the source layer, a potential of the drain layer, and a potential of the body region.

7. The semiconductor memory device according to claim 1, wherein the first potential is equal to or higher than the second potential.

8. The semiconductor memory device according to claim 1, wherein the first and the second currents in the refresh operation of a data holding mode in which an access of writing data from the outside or reading data to the outside is not performed during a constant period or more are smaller respectively than the first and the second currents in the refresh operation of an active mode in which a period from the access to the next access is smaller than the constant period.

9. The semiconductor memory device according to claim 1, wherein after the second refresh operation is performed, the first refresh operation is performed without returning a potential of the gate electrode to the data holding state, and thereafter returns a potential of the gate electrode to the data holding state.

10. The semiconductor memory device according to claim 9, wherein the first and the second currents in the refresh operation of a data holding mode in which an access of writing data from the outside or reading data to the outside is not performed during a constant period or more are smaller respectively than the first and the second currents in the refresh operation of an active mode in which a period from the access to the next access is smaller than the constant period.

11. The semiconductor memory device according to claim 1, wherein after the second refresh operation is performed, a potential of the gate electrode is once set to a potential higher than a potential of the gate electrode in the data holding state and lower than a potential of the gate electrode during the second refresh operation, and thereafter the first refresh operation is performed, a potential of the gate electrode and a potential of the drain layer is returned to the data holding states thereof.

12. The semiconductor memory device according to claim 11, wherein the first and the second currents in the refresh operation of a data holding mode in which an access of writing data from the outside or reading data to the outside is not performed during a constant period or more are smaller respectively than the first and the second currents in the refresh operation of an active mode in which a period from the access to the next access is smaller than the constant period.

13. The semiconductor memory device according to claim 1, wherein after performing the first refresh operation, the semiconductor memory device sets a potential of the gate electrode to a potential lower than a potential of the gate electrode in the data holding state, and thereafter performs the second refresh operation, and returns a potential of the gate electrode and a potential of the drain layer to the data holding state.

14. The semiconductor memory device according to claim 13, wherein the first and the second currents in the refresh operation of a data holding mode in which an access of writing data from the outside or reading data to the outside is not performed during a constant period or more are smaller respectively than the first and the second currents in the refresh operation of an active mode in which a period from the access to the next access is smaller than the constant period.

15. The semiconductor memory device according to claim 1, wherein after the second refresh operation is performed, the first refresh operation is performed without returning a potential of the gate electrode to the data holding state, and thereafter a potential of the gate electrode is decreased to a potential lower than a potential of the gate electrode in the data holding state, and a potential of the gate electrode and a potential of the drain layer are returned to the data holding states thereof.

16. The semiconductor memory device according to claim 15, wherein the first and the second currents in the refresh operation of a data holding mode in which an access of writing data from the outside or reading data to the outside is not performed during a constant period or more are smaller respectively than the first and the second currents in the refresh operation of an active mode in which a period from the access to the next access is smaller than the constant period.

17. The semiconductor memory device according to claim 1 further comprising:
   a selector selecting a bit line from a plurality of bit lines connected to drain layers of a plurality of the memory cells, and connecting the selected bit line to the sense amplifier.

18. The semiconductor memory device according to claim 1 further comprising:
   local bit lines connected to drains of the memory cells;
   a global bit line provided corresponding to a plurality of the local bit lines and connected to the sense amplifier; and
   switching elements provided between the local bit lines and the global bit line.

19. The semiconductor memory device according to claim 1, wherein the first refresh operation is divided into a first operation part and a second operation part,
   in the first operation part, a first potential higher than a potential of the gate electrode in a data holding state being applied to the gate electrode in a state that a potential substantially equal to a potential of the source layer is applied to the drain layer, and
   in the second operation part, a first current to the memory cell by applying a potential of the gate electrode in the data holding state passing to the gate electrode, and
   the first refresh operation is performed between the first operation part and the second operation part.

20. The semiconductor memory device according to claim 19, wherein in the second operation part, a potential of the gate electrode is decreased to a potential lower than a potential of the gate electrode in the data holding state.

21. A driving method of a semiconductor memory device, the semiconductor memory device comprising:
   a semiconductor layer;
   a source layer and a drain layer provided within the semiconductor layer;
   a body region provided in the semiconductor layer between the source layer and the drain layer, the body region being in an electrically floating state, and the body region accumulating a charge or discharging a charge to store logic data;
   a gate dielectric film provided on the body region;
   a gate electrode provided on the body region via the gate dielectric film;
   a driver driving the gate electrode; and
   a sense amplifier sensing logic data from a memory cell including the source layer, the drain layer, and the body region, or writing logic data to the memory cell,
   the method comprising:
   a refresh operation recovering degradation of logic data of the memory cell includes a first refresh operation and a second refresh operation,
   in the first refresh operation, a first potential higher than a potential of the gate electrode in a data holding state is applied to the gate electrode in a state having a potential substantially equal to a potential of the source layer applied to the drain layer, and thereafter a potential of the gate electrode in the data holding state is applied to the gate electrode, thereby a first current passes to the memory cell, and
   in the second refresh operation, a second potential higher than a potential of the gate electrode in the data holding state is applied to the gate electrode, and a third potential higher than a potential of the gate electrode in the data holding state is applied to the drain layer, thereby a second current passes to the memory cell, and
   a state of the memory cell is shifted to an equilibrium state in which an amount of the first current flowing during one cycle of the refresh operation becomes substantially equal to an amount of the second current flowing during one cycle of the refresh operation.

22. The driving method according to claim 19, wherein the first potential is equal to or higher than the second potential.

* * * * *